(12) United States Patent
Ko et al.

(10) Patent No.: US 12,256,615 B2
(45) Date of Patent: Mar. 18, 2025

(54) TRANSPARENT DISPLAY DEVICE

(71) Applicant: LG Display Co., Ltd., Seoul (KR)

(72) Inventors: Taehee Ko, Paju-si (KR); Sunyoung Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 621 days.

(21) Appl. No.: 17/553,709

(22) Filed: Dec. 16, 2021

(65) Prior Publication Data

US 2022/0199755 A1    Jun. 23, 2022

(30) Foreign Application Priority Data

Dec. 23, 2020 (KR) .......................... 10-2020-0181748

(51) Int. Cl.
| | | |
|---|---|---|
| *H10K 59/131* | (2023.01) | |
| *H10K 59/88* | (2023.01) | |
| *H10K 59/38* | (2023.01) | |

(52) U.S. Cl.
CPC ......... *H10K 59/1315* (2023.02); *H10K 59/88* (2023.02); *H10K 59/38* (2023.02)

(58) Field of Classification Search
CPC .... H10K 59/1315; H10K 59/88; H10K 59/38; H10K 59/8792; H10K 59/351; H10K 59/131; G09G 3/3225; G09G 3/006; G09G 2300/0413; G09G 2300/0426; G09G 2320/0233; G09G 2330/12; G02F 1/136204; G02F 1/1309; G02F 1/136259; G02F 1/136286
See application file for complete search history.

(56) References Cited

U.S. PATENT DOCUMENTS

| | | | |
|---|---|---|---|
| 7,488,977 B2 | 2/2009 | Sung et al. | |
| 7,812,523 B2 | 10/2010 | Jung et al. | |
| 2007/0120473 A1* | 5/2007 | Nakamura | H10K 59/1315 313/506 |
| 2013/0208017 A1 | 8/2013 | Gu et al. | |
| 2014/0049453 A1 | 2/2014 | Lee et al. | |
| 2015/0279868 A1 | 10/2015 | Park et al. | |
| 2016/0163770 A1 | 6/2016 | Kim et al. | |
| 2019/0043933 A1 | 2/2019 | Sato | |
| 2020/0373374 A1* | 11/2020 | Park | H01L 27/0248 |

(Continued)

FOREIGN PATENT DOCUMENTS

| | | |
|---|---|---|
| CN | 101630072 A | 1/2010 |
| CN | 103163668 A | 6/2013 |

(Continued)

*Primary Examiner* — Sitaramarao S Yechuri
(74) *Attorney, Agent, or Firm* — Seed IP Law Group LLP

(57) ABSTRACT

A transparent display device includes a substrate provided with a display area on which subpixels are disposed, a first non-display area disposed on one side of the display area, and a second non-display area disposed on another side of the display area. Power shorting bars are in the first non-display area over the substrate and extend in parallel in a first direction. Power lines are positioned in the display area over the substrate, extend in a second direction and are coupled to the power shorting bars. A first transmissive area is positioned between the power lines, and a second transmissive area is positioned between the power shorting bars, both of which have substantially the same shape. The shorting bars are coupled together on at least one end.

29 Claims, 10 Drawing Sheets

(56) References Cited

U.S. PATENT DOCUMENTS

2021/0013271 A1* 1/2021 Kim .................. H10K 71/00
2021/0202680 A1   7/2021 Shin et al.
2022/0180792 A1   6/2022 Choi et al.

FOREIGN PATENT DOCUMENTS

| CN | 111312064 A | 6/2020 |
| JP | H09325361 A | 12/1997 |
| JP | 2017040876 A | 2/2017 |
| JP | 2017120408 A | 7/2017 |
| KR | 1020050068148 A | 7/2005 |
| KR | 20200115430 A | 10/2020 |

* cited by examiner

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, an organic light emitting display (OLED) device, and a quantum dot light emitting display (QLED) device have been widely utilized.

Recently, studies for transparent display devices for allowing a user to look at objects or images positioned on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

Signal lines or connection electrodes may be disposed in a non-display area. In a transparent display device, in order to reduce resistance of the signal lines or connection electrodes, which are disposed in the non-display area, the signal lines or connection electrodes may be formed of a metal material having low resistance.

BRIEF SUMMARY

The inventors have realized that the metal material having low resistance is generally opaque, such that transmittance is reduced in the non-display area. The present disclosure has been made in view of various technical problems including the above problems, and various embodiments of the present disclosure provide a transparent display device having increased transmittance in a non-display area while having reduced resistance in power lines.

Another technical feature of the present disclosure is a transparent display device with improved visual uniformity between a non-display area and a display area. The improved visual uniformity may reduce appearance of a recognizable interface or boundary between the display area and the surrounding non-display areas.

Another technical feature of the present disclosure is a transparent display device in which static electricity is prevented from occurring between a plurality of signal lines or connection electrodes disposed in a non-display area.

In addition to the technical benefits of the present disclosure mentioned above, additional technical benefits and features of the present disclosure will be clearly understood by those skilled in the art from the following description of the present disclosure.

In accordance with an embodiment of the present disclosure, the above and other technical benefits can be accomplished by the provision of a transparent display device comprising a substrate, a plurality of power shorting bars, a plurality of power lines, a first transmissive area, and a second transmissive area. The substrate has a display area on which a plurality of subpixels are disposed. A first non-display area is disposed on one side of the display area, and a second non-display area is disposed on another side of the display area. The plurality of power shorting bars are provided in the first non-display area on the substrate and extend in parallel in a first direction. The plurality of power lines are provided in the display area over the substrate, extend in a second direction, and are coupled with the plurality of power shorting bars. The first transmissive area is provided between the plurality of power lines, and the second transmissive area is provided between the plurality of power shorting bars. The second transmissive area has substantially the same shape as that of the first transmissive area. The plurality of shorting bars are coupled with each other on at least one end.

In accordance with another aspect of the present disclosure, the above and other objects can be accomplished by the provision of a transparent display device comprising a substrate, a plurality of pixel power shorting bars, a first pixel power connection electrode, a plurality of common power shorting bars and a first common power connection electrode. The substrate is provided with a display area on which a plurality of subpixels are disposed. A first non-display area is disposed on one side of the display area, and a second non-display area is disposed on another side of the display area. The plurality of pixel power shorting bars are provided in the first non-display area over the substrate, extend in parallel in a first direction, and are spaced apart from each other. The first pixel power connection electrode couples ends of the plurality of pixel power shorting bars to each other. The plurality of common power shorting bars are provided in the first non-display area over the substrate, extend in parallel in the first direction, and are spaced apart from each other. The first common power connection electrode couples ends of the plurality of common power shorting bars to each other.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
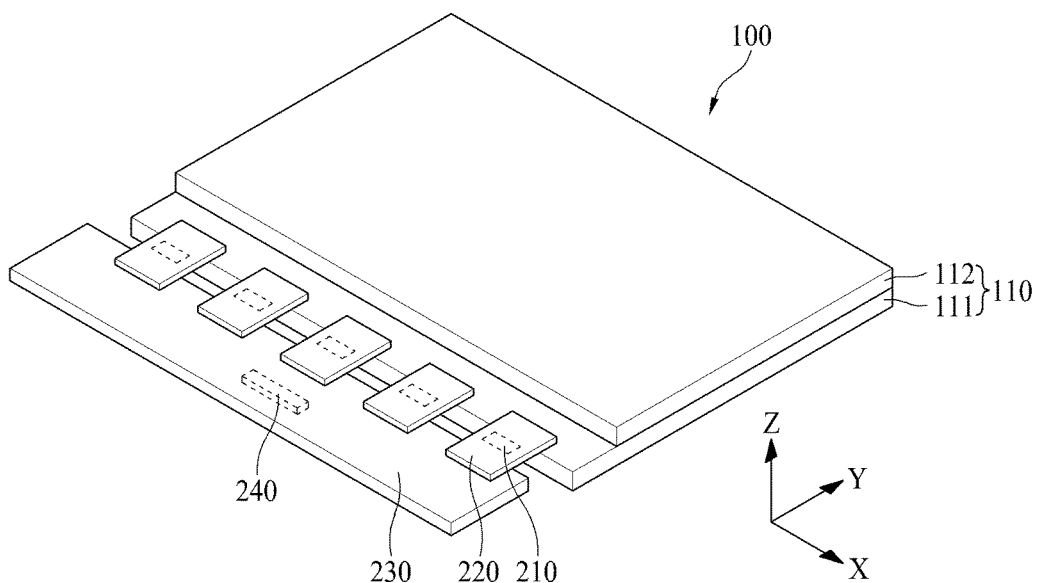
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure relevant features of the present disclosure, the detailed description will be omitted. In a case where 'comprise,' 'have,' and 'include' described in the present specification are used, another part may be added unless 'only' is used. Terms of a singular form may include plural forms unless referred to the contrary.

In construing an element, the element is construed as including an error range even in the absence of explicit description thereof.

In describing a positional relationship, for example, when the position relationship is described as 'upon,' 'above,' 'below,' and 'next to,' one or more portions may be arranged between two other portions unless 'just' or 'direct' is used.

It will be understood that, although the terms "first," "second," etc., may be used herein to describe various elements, these elements should not be limited by these terms. These terms are generally used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless otherwise mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a scan line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
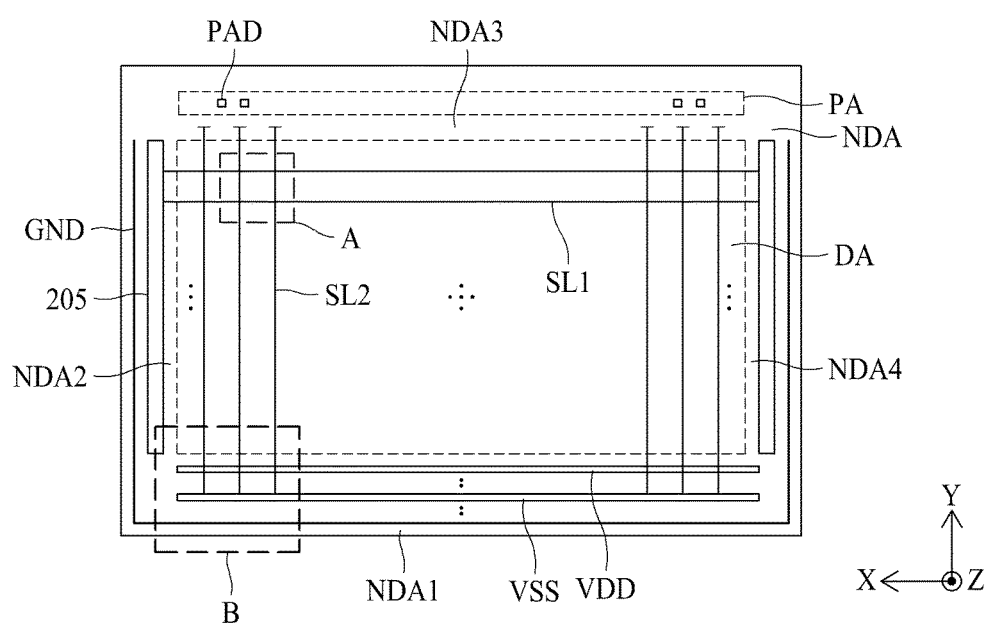
FIG. 2 is a schematic plane view illustrating a transparent display panel according to one embodiment of the present disclosure.
Figure 3:
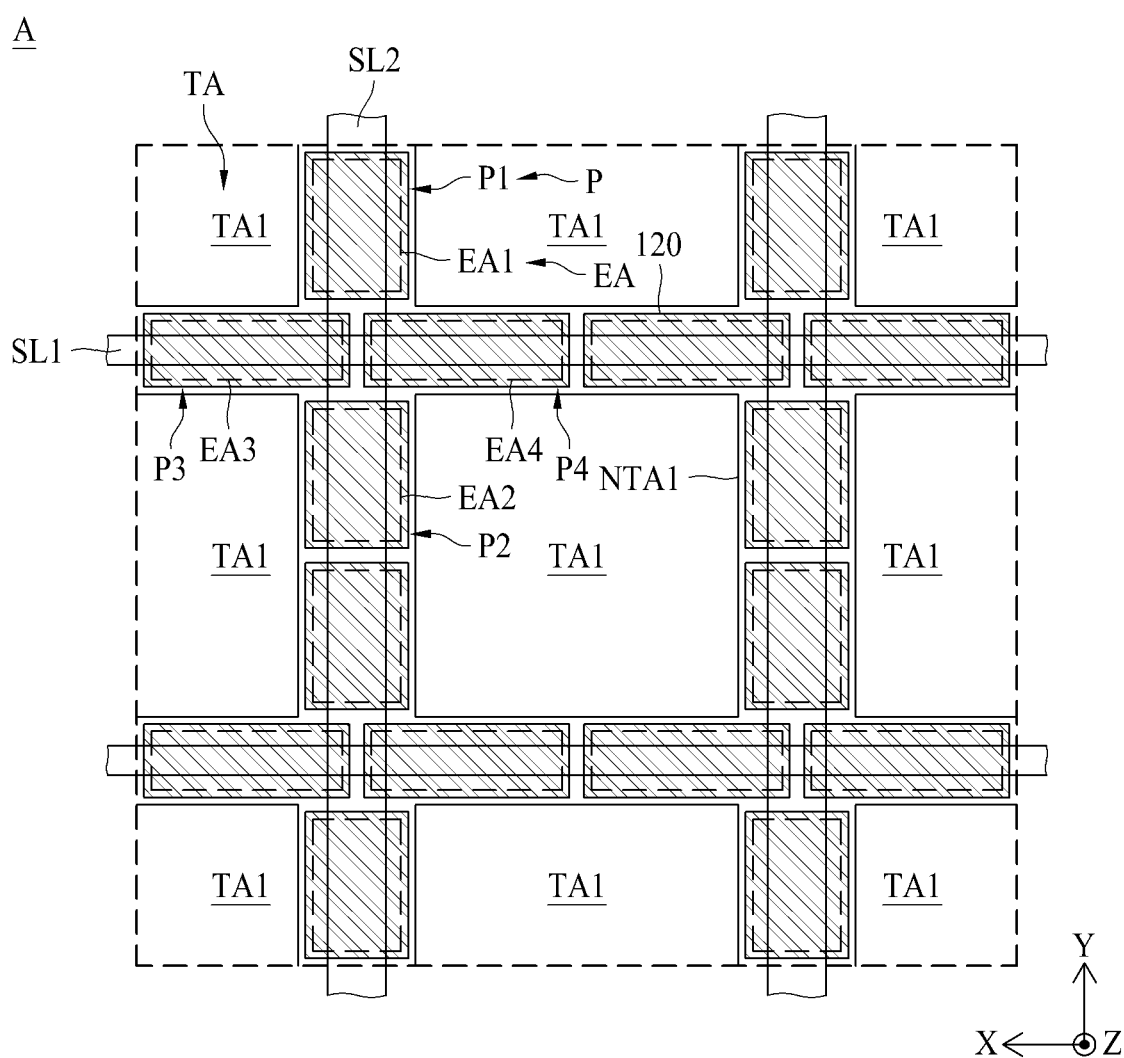
FIG. 3 is an enlarged view illustrating an area A of FIG. 2.
Figure 4:
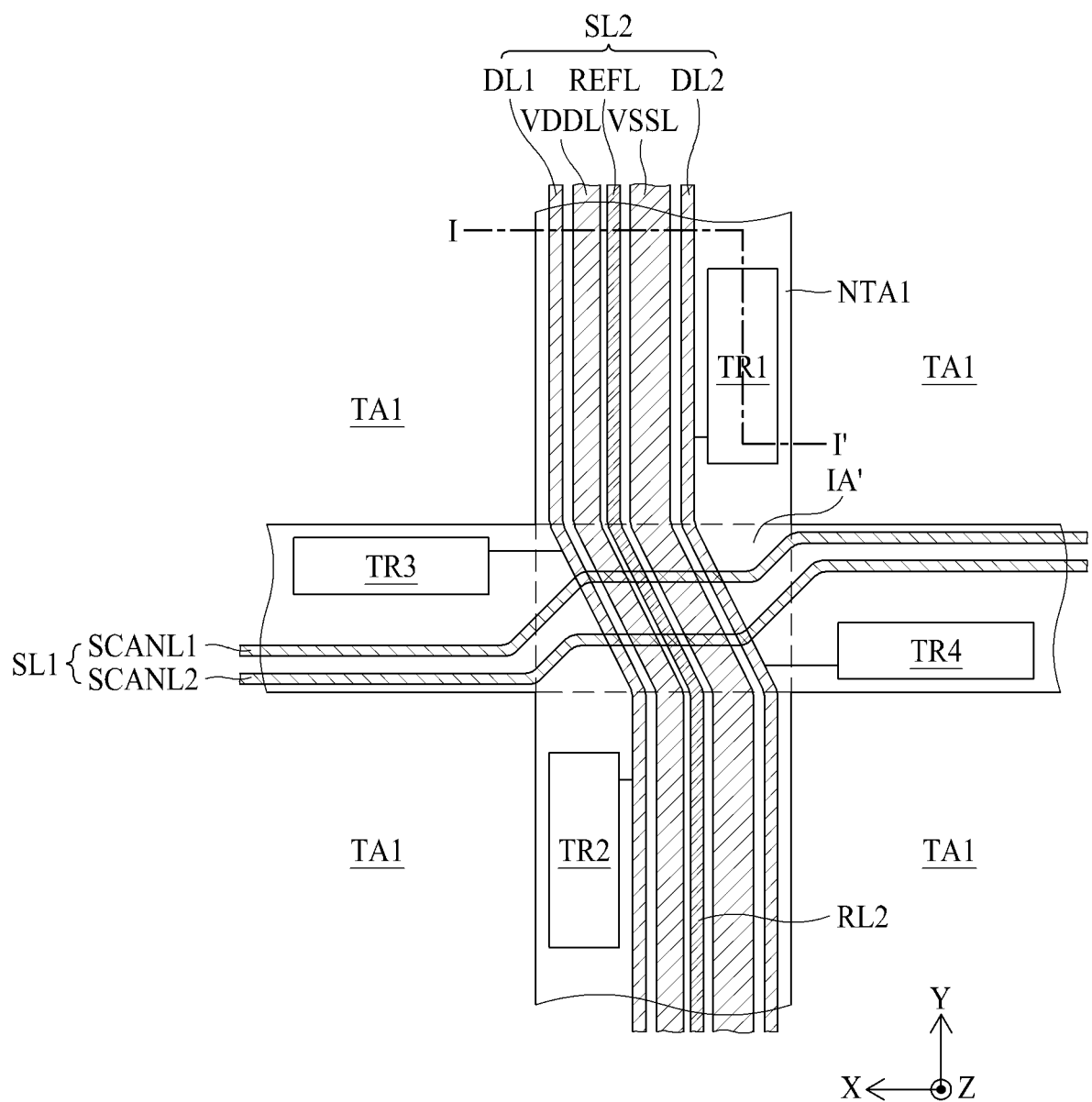
FIG. 4 is a view illustrating an example in which a plurality of signal lines and a plurality of driving transistors are disposed.

FIG. 2 is a schematic plane view illustrating a transparent display panel according to one embodiment of the present disclosure, and FIG. 3 is an enlarged view illustrating an area A of FIG. 2. FIG. 4 is a view illustrating an example in which a plurality of signal lines and a plurality of driving transistors are disposed, and FIG. 5 is a cross-sectional view taken along line I-I' of FIG. 4.

Figure 5:
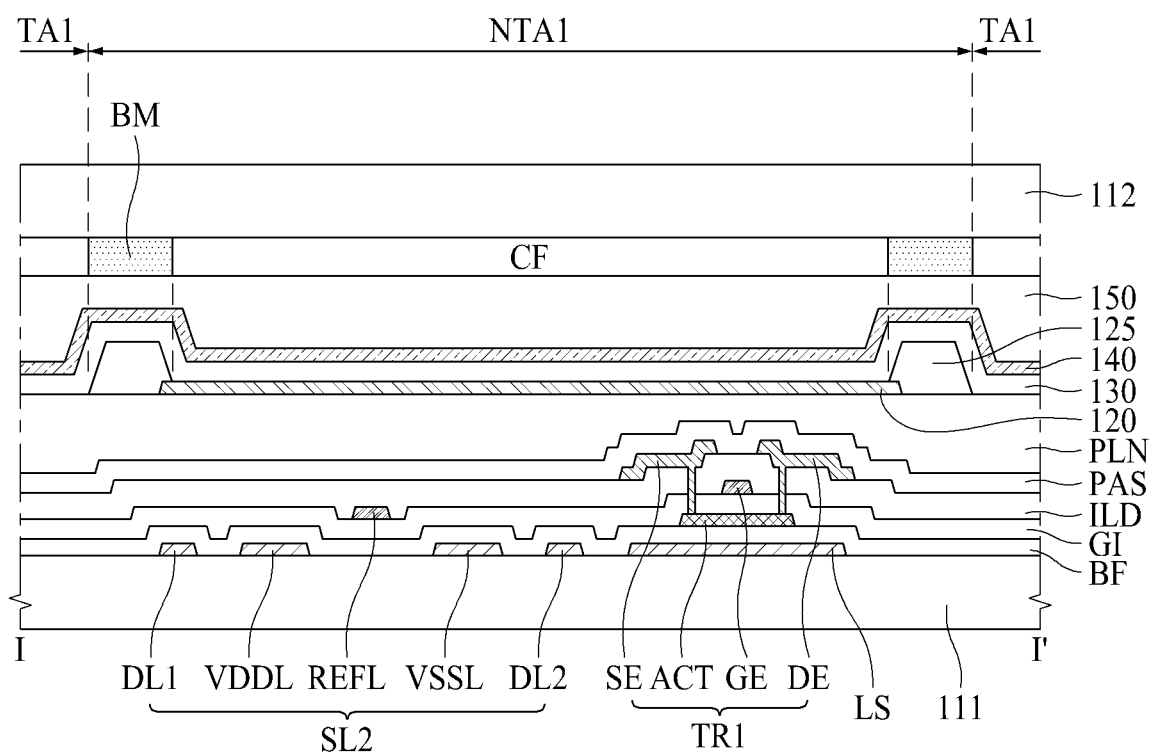
FIG. 5 is a cross-sectional view taken along line I-I' of FIG. 4.

Referring to FIG. 2 and FIG. 5, the first substrate 111 may include a display area DA provided with pixels P to display an image, and a non-display area NDA for not displaying an image.

The non-display area NDA may be provided with a pad area PA in which pads PAD are disposed, and at least one scan driver 205.

The scan driver 205 are connected to the scan lines SCANL1 and SCANL2 and supplies scan signals to the scan lines SCANL1 and SCANL2. The scan driver 205 may be or include a gate driver, and may be referred to as a gate driver.

The scan driver 205 may be disposed in one side of the display area DA of the transparent display panel 110, or the non-display area NDA of both peripheral sides of the transparent display panel 110 by a gate driver in panel (GIP) method. For example, as shown in FIG. 2, the scan driver 205 may be provided in both side of the display area DA of the transparent display panel 110, but these scan drivers are not limited thereto. The scan driver 205 may be provided on a single side of the display area DA of the transparent display panel 110, and other sides of the display area DA may be free of the scan driver 205.

The display area DA, as shown in FIG. 3, includes a first transmissive area TA1 and a first non-transmissive area NTA1. The first transmissive area TA1 is an area through which most of externally incident light passes, and the first non-transmissive area NTA1 is an area through which most of externally incident light fails to transmit. For example, the first transmissive area TA1 may be an area where light transmittance is greater than α %, for example, about 90%, and the first non-transmissive area NTA1 may be an area where light transmittance is smaller than β %, for example, about 50%. At this time, α is greater than β. A user may view an object or background arranged over a rear surface of the transparent display panel 110 due to the first transmissive area TA1.

The first non-transmissive area NTA1 may include a plurality of pixels P, and a plurality of first signal lines SL1 and a plurality of second signal lines SL2 to supply signals to each of a plurality of pixels P.

The plurality of first signal lines SL1 may be extended in a first direction (e.g., X-axis direction). The plurality of first signal lines SL1 may cross the plurality of second signal lines SL2. For example, each of the plurality of first signal lines SL1 may include at least one scan line.

Hereinafter, when the first signal line SL1 includes a plurality of lines, one first signal line SL1 may refer to a signal line group including a plurality of lines. For example, when the first signal line SL1 includes two scan lines, one first signal line SL1 may refer to a signal line group including two scan lines.

The plurality of second signal lines SL2 may be extended in a second direction (e.g., Y-axis direction). For example, each of the plurality of second signal lines SL2 may include at least one of at least one data line, a pixel power line, a reference line, or a common power line.

Hereinafter, when the second signal line SL2 includes a plurality of lines, one second signal line SL2 may refer to a signal line group including a plurality of lines. For example, when the second signal line SL2 includes two data lines, a pixel power line, a common power line, and a reference line, one second signal line SL2 may refer to a signal line group including two data lines, a pixel power line, a common power line, and a reference line.

A first transmissive area TA1 may be disposed between the first signal lines SL1 adjacent to each other. In addition, a first transmissive area TA1 may be disposed between the second signal lines SL2 adjacent to each other. That is, the first transmissive area TA1 may be surrounded by two first signal lines SL1 and two second signal lines SL2.

Pixels P may be provided to overlap at least one of the first signal line SL1 and the second signal line SL2, thereby emitting predetermined light or selected light to display an image. An emission area EA may correspond to an area, from which light is emitted, in the pixel P.

Each of the pixels P may include at least one of a first subpixel P1, a second subpixel P2, a third subpixel P3 and a fourth subpixel P4. The first subpixel P1 may include a first emission area EA1 emitting light of a green color. The second subpixel P2 may include a second emission area EA2 emitting light of a red color. The third subpixel P3 may include a third emission area EA3 emitting light of a blue color. The fourth subpixel P4 may include a fourth emission area EA4 emitting light of a white color. However, the emission areas are not limited to this example. Each of the pixels P may further include a subpixel emitting light of a color other than red, green, blue and white. Also, the arrangement order of the subpixels P1, P2, P3 and P4 may be changed in various ways.

Hereinafter, for convenience of description, the description will be given based on that a first subpixel P1 is a green subpixel emitting green light, a second subpixel P2 is a red subpixel emitting red light, a third subpixel P3 is a blue subpixel emitting blue light, and a fourth subpixel P4 is a white subpixel emitting white light.

The first subpixel P1 and the second subpixel P2 may be provided to overlap at least a portion of the second signal line SL2, and may alternately be disposed along the second signal line SL2.

The third subpixel P3 and the fourth subpixel P4 may be provided to at least partially overlap the first signal line SL1, and may alternately be disposed along the first signal line SL1.

The third subpixel P3 and the fourth subpixel P4 may be provided in an area where the first signal line SL1 and the second signal line SL2 cross each other, as shown in FIG. 3, but are not limited thereto.

In another embodiment, the first subpixel P1 and the second subpixel P2 may be disposed in the area where the first signal line SL1 and the second signal line SL2 cross each other. In this case, the third subpixel P3 and the fourth subpixel P4 may be spaced apart from each other in the area where the first signal line SL1 and the second signal line SL2 cross each other, with the first subpixel P1 and the second subpixel P2, which are interposed therebetween.

Each of the first subpixel P1, the second subpixel P2, the third subpixel P3 and the fourth subpixel P4 may include a circuit element including a capacitor, a thin film transistor, and the like, and a light emitting element. The thin film transistor may include a switching transistor, a sensing transistor, and driving transistors TR1, TR2, TR3 and TR4.

The switching transistor is switched in accordance with a scan signal supplied to scan lines SCANL1 and SCANL2 to supply data voltages supplied from data lines DL1 and DL2 to the driving transistors TR1, TR2, TR3 and TR4.

The sensing transistor serves to sense deviation in a threshold voltage of the driving transistors TR1, TR2, TR3 and TR4, which causes deterioration of image quality.

The driving transistors TR1, TR2, TR3 and TR4 are switched in accordance with the data voltage supplied from the switching thin film transistor to generate a data current from a power source supplied from a pixel power line VDDL and supply the data current to the first electrode 120 of the subpixel. The driving transistors TR1, TR2, TR3 and TR4 include an active layer ACT, a gate electrode GE, a source electrode SE, and a drain electrode DE.

The capacitor serves to maintain the data voltage supplied to the driving transistors TR1, TR2, TR3 and TR4 for one frame. The capacitor may include a first capacitor electrode and a second capacitor electrode.

In detail, the active layer ACT may be provided over the first substrate 111. The active layer ACT may be formed of a silicon based semiconductor material or an oxide based semiconductor material.

A light-shielding layer LS may be provided between the active layer ACT and the first substrate 111. The light-shielding layer LS may serve as a light shielding layer for shielding external light entering the active layer ACT. The light-shielding layer LS may be made of a conductive material. For example, the light-shielding layer LS may be formed of a single layer or a multi-layer made of any one of Mo, Al, Cr, Au, Ti, Ni, Nd and Cu, or their alloy. In this case, a buffer layer BF may be provided between the light-shielding layer LS and the active layer ACT.

A gate insulating layer GI may be provided over the active layer ACT. The gate insulating layer GI may be formed of an inorganic film, for example, a silicon oxide film (SiOx), a silicon nitride film (SiNx) or a multi-layered film of SiOx and SiNx.

The gate electrode GE may be provided over the gate insulating layer GI. The gate electrode GE may be formed of a single layer or a multi-layer made of any one of Mo, Al, Cr, Au, Ti, Ni, Nd and Cu, or their alloy.

An inter-layer dielectric layer ILD may be provided over the gate electrode GE. The inter-layer dielectric layer ILD may be made of an inorganic film, for example, a silicon oxide film (SiOx), a silicon nitride film (SiNx) or a multi-layered film of SiOx and SiNx.

The source electrode SE and the drain electrode DE may be provided over the inter-layer dielectric layer ILD. The source electrode SE and the drain electrode DE may be connected to the active layer ACT through a contact hole passing through the gate insulating layer GI and the inter-layer dielectric layer ILD.

The source electrode SE and the drain electrode DE may be made of a single layer or a multi-layer of any one of Mo, Al, Cr, Au, Ti, Ni, Nd and Cu, or their alloy.

A passivation layer PAS for protecting the driving transistor TR may be provided over the source electrode SE and the drain electrode DE.

A planarization layer PLN for planarizing a step difference caused by the driving transistor TR1, TR2, TR3, TR4 may be provided over the passivation layer PAS. The planarization layer PLN may be formed of an organic film such as acryl resin, epoxy resin, phenolic resin, polyamide resin, and polyimide resin.

Each of the light emitting diodes including the first electrode 120, the organic light emitting layer 130 and the second electrode 140, and a bank 125 are provided over a planarization layer PLN.

The first electrode 120 may be provided over a planarization layer PLN and connected with the driving transistor TR1, TR2, TR3, TR4. In detail, the first electrode 120 may be connected to the source electrode SE or drain electrode DE of the driving transistor TR1, TR2, TR3, TR4 through a contact hole passing through the planarization layer PLN and the passivation layer PAS. Accordingly, the first electrode 120 may be electrically connected to the driving transistor TR1, TR2, TR3, TR4.

The first electrode 120 may be provided for each of the subpixels P1, P2, P3 and P4. One first electrode 120 may be provided in the first subpixel P1, another first electrode 120 may be provided in the second subpixel P2, the other first electrode 120 may be provide in the third subpixel P3, and the other first electrode 120 may be provided in the fourth subpixel P4. The first electrode 120 is not provided in the transmissive area TA.

The first electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO, MoTi alloy and a deposited structure (ITO/MoTi alloy/ITO) of MoTi alloy and ITO. The Ag alloy may be an alloy of silver (Ag), palladium (Pb), and Copper (Cu). The MoTi alloy may be an alloy of molybdenum (Mo) and titanium (Ti). The first electrode 120 may be anode electrode.

The bank 125 may be provided over the planarization layer PLN. In addition, the bank 125 may be provided between the first electrodes 120. The bank 125 may be provided to cover or at least partially cover edges of each of the first electrodes 120 and expose a portion of each of the first electrodes 120. Therefore, the bank 125 may prevent light emission efficiency from being deteriorated by a current concentrated on each end of the first electrodes 120.

The bank 125 may border the light emission areas EA1, EA2, EA3 and EA4 of each of the subpixels P1, P2, P3 and P4. The light emission areas EA1, EA2, EA3 and EA4 of each of the subpixels P1, P2, P3 and P4 refer to areas in which the first electrode 120, the organic light emitting layer 130, and the second electrode 140 are sequentially deposited so that holes from the anode electrode 120 and electrons from the second electrode 140 are combined with each other in the organic light emitting layer 130 to emit light. In this case, since the area in which the bank 125 is provided does not emit light, the area may be a non-light emission area, and the area in which the bank 125 is not provided and the first electrode 120 is exposed may be the light emission areas EA1, EA2, EA3 and EA4.

The bank 125 may be formed of an organic layer, for example, acryl resin, epoxy resin, phenolic resin, polyamide resin, polyimide resin, etc.

The organic light emitting layer 130 may be provided over the first electrode 120. The organic light emitting layer 130 may include a hole transporting layer, a light emitting layer, and an electron transporting layer. In this case, if a voltage is applied to the first electrode 120 and the second electrode 140, holes and electrons move to the light emitting layer through the hole transporting layer and the electron transporting layer, respectively, and are combined with each other in the light emitting layer to emit light.

In one embodiment, the organic light emitting layer 130 may be a common layer commonly provided for the subpixels P1, P2, P3 and P4. For example, the organic light emitting layer 130 may be a white light emitting layer emitting white light.

In another embodiment, the organic light emitting layer 130 may include light emitting layers provided per subpixels P1, P2, P3 and P4. For example, a green light emitting layer emitting green light may be provided in the first subpixel P1, a red light emitting layer emitting red light may be provided in the second subpixel P2, a blue light emitting layer emitting blue light may be provided in the third subpixel P3, and a white light emitting layer emitting white light may be provided in the fourth subpixel P4. In this case, the light emitting layers of the organic light emitting layer 130 are not provided in the transmissive area TA.

The second electrode 140 may be provided over the organic light emitting layer 130 and the bank 125. The second electrode 140 may be provided in the first transmissive area TA1 as well as the first non-transmissive area NTA1 that includes the emission area EA, but is not limited thereto. In one embodiment, the second electrode 140 may be provided only in the first non-transmissive area NTA1 that includes the emission area EA, but may not be provided in the first transmissive area TA1 to improve transmittance.

The second electrode 140 may be a common layer commonly provided in the subpixels P1, P2, P3 and P4 to apply the same voltage. The second electrode 140 may be formed of a conductive material that may transmit light. For example, the second electrode 140 may be formed of a low resistance metal material, for example, Ag, or alloy of Mg and Ag. The second electrode 140 may be a cathode electrode.

An encapsulation layer 150 may be provided over the light emitting diodes. The encapsulation layer 150 may be provided over the second electrode 140 to overlay the second electrode 140. The encapsulation layer 150 serves to prevent oxygen or water from being permeated into the organic light emitting layer 130 and the second electrode 140. To this end, the encapsulation layer 150 may include at least one inorganic layer and at least one organic layer.

Meanwhile, although not shown in FIG. 5, a capping layer may additionally be provided between the second electrode 140 and the encapsulation layer 150.

A color filter CF may be provided over the encapsulation layer 150. The color filter CF may be provided over one surface of the second substrate 112 that faces the first substrate 111. In this case, the first substrate 111 provided with the encapsulation layer 150 and the second substrate 112 provided with the color filter CF may be bonded to each other by an adhesive layer 160. At this time, the adhesive layer 160 may be an optically clear resin (OCR) layer or an optically clear adhesive (OCA) film.

The color filter CF may be provided to be patterned for each of the subpixels P1, P2, P3 and P4. In detail, the color filter CF may include a first color filter, a second color filter, and a third color filter. The first color filter may be disposed to correspond to the emission area EA1 of the first subpixel P1, and may be a green color filter that transmits green light. The second color filter may be disposed to correspond to the emission area EA2 of the second subpixel P2, and may be a red color filter that transmits red light. The third color filter may be disposed to correspond to the emission area EA3 of the third subpixel P3, and may be a blue color filter that transmits blue light. The color filter CF may further include a fourth color filter disposed to correspond to the emission area EA4 of the fourth subpixel P4. In this case, the fourth color filter may be made of a transparent organic material that transmits white light.

The transparent display panel 110 according to one embodiment of the present disclosure may prevent transmittance from being reduced as a polarizer is not attached thereto. Also, in the transparent display panel 110 according to one embodiment of the present disclosure, the color filter CF may be provided in the second substrate 112 to partially absorb externally incident light, thereby preventing the incident light from being reflected in the electrodes. That is, the transparent display panel 110 according to one embodiment of the present disclosure may reduce external light reflectance without reducing transmittance.

Meanwhile, a black matrix BM may be provided between color filters CF and between the color filter CF and the first transmissive area TA1. The black matrix BM may be disposed between the subpixels P1, P2, P3 and P4 to prevent a color mixture from occurring between adjacent subpixels P1, P2, P3 and P4.

The black matrix BM may include a material that absorbs light, for example, a black dye that fully absorbs light of a visible light wavelength range Hereinafter, an example in which the first signal line SL1, the second signal line SL2, and the driving transistor TR are disposed will be described in detail with reference to FIGS. 4 and 5.

As described above, the display area DA includes a first transmissive area TA1 and a first non-transmissive area NTA1. The first non-transmissive area NTA1 may be extended in a first direction (e.g., X-axis direction) between adjacent transmissive areas TA, or may be extended in a second direction (e.g., Y-axis direction) between adjacent transmissive areas TA.

The second signal line SL2 and the driving transistors TR1 and TR2 of the subpixels P1 and P2 disposed to overlap at least a portion of the second signal line SL2 may be disposed in the first non-transmissive area NTA1. For example, the first and second subpixels P1 and P2 may be provided to overlap at least a portion of the second signal line SL2, and may alternately be disposed along the second signal line SL2. The second signal line SL2, the first driving transistor TR1 of the first subpixel P1, and the second driving transistor TR2 of the second subpixel P2 may be disposed in the first non-transmissive area NTA1.

The second signal line SL2 may be provided in the first non-transmissive area NTA1 and extended in the second direction (e.g., Y-axis direction). The second signal line SL2 may include a plurality of signal lines, for example, a power line. The power line may include a first power line and a second power line.

The first power line may be provided in the first non-transmissive area NTA1, and may be extended in the second direction (e.g., Y-axis direction). In one embodiment, the first power line may be a pixel power line VDDL that supplies a first power source to the first electrode 120 of each of the subpixels P1, P2, P3 and P4.

The second power line may be provided in the first non-transmissive area NTA1, and may be extended in the second direction (e.g., Y-axis direction) in parallel with the first power line. In one embodiment, the second power line may be a common power line VSSL for supplying a second power source to the second electrode 140 of each of the subpixels P1, P2, P3 and P4.

For example, the second signal line SL2 may further include a first data line DL1, a reference line REFL, and a second data line DL2.

In detail, the reference line REFL may be provided in the first non-transmissive area NTA1 and extended in the second direction (e.g., Y-axis direction). The reference line REFL may supply a reference voltage (or an initialization voltage or a sensing voltage) to the driving transistor TR of each of the subpixels P1, P2, P3 and P4 provided in the display area DA.

The first data line DL1 may be provided in the first non-transmissive area NTA1, disposed on the first side of the reference line REFL and extended in the second direction (e.g., Y-axis direction). The first data line DL1 may supply the data voltage to at least a portion of the subpixels P1, P2, P3 and P4 provided in the display area DA.

For example, the first data line DL1 may supply a first data voltage to the second driving transistor TR2 of the second subpixel P2 and the third driving transistor TR3 of the third subpixel P3, which are disposed on the first side of the reference line REFL.

The second data line DL2 may be provided in the first non-transmissive area NTA1, disposed on the second side of the reference line REFL and extended in the second direction (e.g., Y-axis direction). At this time, the second side of the reference line REFL may be a side facing the first side. For example, when the first side is a left side of the reference line REFL, the second side may be a right side of the reference line REFL. The second data line DL2 may supply a data voltage to the other subpixels except the subpixel connected with the first data line among the subpixels P1, P2, P3 and P4 provided in the display area DA.

For example, the second data line DL2 may supply a second data voltage to the first driving transistor TR1 of the first subpixel P1 and the fourth driving transistor TR4 of the fourth subpixel P4, which area disposed on the second side of the reference line REFL.

In the transparent display panel 110 according to one embodiment of the present disclosure, the reference line REFL may not be disposed to be adjacent to the first and second data lines DL1 and DL2. A constant voltage may be applied to the reference line REFL, whereas a data voltage may be applied to the data lines DL1 and DL2 in the form of a pulse. When the reference line REFL is disposed to be adjacent to the data lines DL1 and DL2, a crosstalk phenomenon caused by capacitive coupling between the reference line REFL and the data line DL1 and DL2 may occur when voltage variation occurs in the data lines DL1 and DL2. In this case, the voltage of the reference line REFL may vary, and furthermore, luminance of the subpixels P1, P2, P3 and P4 may be changed. As a result, a dark line or a bright line may be generated.

The transparent display panel 110 may be provided with a first transmissive area TA1 of a wide area to make sure of light transmittance, and may be provided with a first non-transmissive area NTA1 of a relatively narrow area. The plurality of signal lines do not have transmittance, and thus may be disposed in the first non-transmissive area NTA1. In this case, since the plurality of signal lines are disposed in the first non-transmissive area NTA1 of the narrow area in the transparent display panel 110 as compared with a general display panel, the spaced distance between the signal lines has no choice but to be reduced. For this reason, in the transparent display panel 110, parasitic capacitance between the reference line REFL and the data line DL1 and DL2 may be increased, and the cross talk phenomenon caused by the capacitive coupling may occur more seriously.

In the transparent display panel 110 according to one embodiment of the present disclosure, in order to reduce parasitic capacitance between the reference line REFL and the data line DL1 and DL2 in a limited space, the reference line REFL and the data line DL1 and DL2 may not be disposed to be adjacent to each other.

In detail, in the transparent display panel 110 according to one embodiment of the present disclosure, the pixel power line VDDL or the common power line VSSL may be disposed between the reference line REFL and the first data line DL1, whereby the reference line REFL and the first data line DL1 may not be disposed to be adjacent to each other. In addition, the pixel power line VDDL or the common power line VSSL may be disposed between the reference line REFL and the second data line DL2, whereby the reference line REFL and the second data line DL2 may not be disposed to be adjacent to each other. Since a constant power voltage not a pulse type is applied to the pixel power line VDDL or the common power line VSSL, the pixel power line VDDL or the common power line VSSL may less affect the reference line REFL.

That is, in the transparent display panel 110 according to one embodiment of the present disclosure, another signal line may be disposed between the reference line REFL and the data line DL1 and DL2, whereby the spaced distance between the reference line REFL and the data line DL1 and DL2 may be increased. Therefore, in the transparent display panel 110 according to one embodiment of the present disclosure, parasitic capacitance between the reference line REFL and the data line DL1 and DL2 may be reduced.

Meanwhile, in the transparent display panel 110 according to one embodiment of the present disclosure, the reference line REFL may be provided on a layer different from that of the data lines DL1 and DL2. In detail, the reference line REFL may be provided on a first layer, and the data lines DL1 and DL2 may be provided on a second layer different from the first layer.

In one embodiment, the reference line REFL may be provided on the same layer as one of the elements constituting the driving transistor TR. In detail, the reference line REFL may be provided on the same layer as any one of the active layer ACT, the gate electrode GE, the source electrode SE and the drain electrode DE of the driving transistor TR. For example, the reference line REFL may be provided on the same layer as the gate electrode GE as shown in FIG. 5.

In one embodiment, the data lines DL1 and DL2 may be provided between the driving transistor TR and the substrate 111. For example, the data lines DL1 and DL2 may be provided on the same layer as the light shielding layer LS as shown in FIG. 5.

In the transparent display panel 110 according to one embodiment of the present disclosure, the reference line REFL and the data lines DL1 and DL2 may be provided on their respective layers different from each other, whereby the spaced distance between the reference line REFL and the data lines DL1 and DL2 in a limited space may be increased. Therefore, the transparent display panel 110 according to one embodiment of the present disclosure may reduce parasitic capacitance between the reference line REFL and the data lines DL1 and DL2.

The first driving transistor TR1 and the second driving transistor TR2 may be disposed in a zigzag pattern without being disposed on a straight line. In detail, as shown in FIG. 4, the first driving transistor TR1 may be disposed on one side of a first center line parallel with the second direction (e.g., Y-axis direction) in the first non-transmissive area NTA1, and the second driving transistor TR2 may be disposed on the other side of the first center line.

That is, the first driving transistor TR1 may be disposed on the second side of the reference line REFL, and may be provided between the second data line DL2 and the first transmissive area TA1. The second driving transistor TR2 may be disposed on the first side of the reference line REFL, and may be provided between the first data line DL1 and the first transmissive area TA1.

The transparent display panel 110 according to one embodiment of the present disclosure is characterized in that the first driving transistor TR1 and the second driving transistor TR2 are disposed in a zigzag pattern.

For example, it is assumed that the first driving transistor TR1 and the second driving transistor TR2 are disposed on a straight line on the first side of the reference line REFL. The first driving transistor TR1 may be connected to the first data line DL1, and the second driving transistor TR2 may be connected to the second data line DL2. At this time, a connection line for connecting the second driving transistor TR2 with the second data line DL2 should across the first data line DL1, the pixel power line VDDL, the reference line REFL, and the common power line VSSL. Therefore, the connection line for connecting the second driving transistor TR2 with the second data line DL2 may have a longer length, and loss may occur in the data voltage due to resistance.

In addition, since a connection line for connecting the first driving transistor TR1 with the first data line DL1 and the connection line for connecting the second driving transistor TR2 with the second data line DL2 are different from each other in length, a deviation in data voltages may occur.

In the transparent display panel 110 according to one embodiment of the present disclosure, the first driving transistor TR1 and the second driving transistor TR2 may be disposed in a zigzag pattern so that the connection line for connecting the first driving transistor TR1 with the second data line DL2 and the connection line for connecting the second driving transistor TR2 with the first data line DL1 may have the same or similar length.

Therefore, the transparent display panel 110 according to one embodiment of the present disclosure may prevent deviation in a signal voltage applied to each of the first driving transistor TR1 and the second driving transistor TR2 from occurring.

In addition, the transparent display panel 110 according to one embodiment of the present disclosure may reduce the lengths of the connection lines for connecting the second and first signal lines DL2 and DL1 with the first and second driving transistors TR1 and TR2. The transparent display panel 110 according to one embodiment of the present disclosure may prevent loss of a signal voltage, such as a data voltage, from occurring.

The first signal line SL1 and the driving transistors TR3 and TR4 of the subpixels P3 and P4 disposed to overlap at least a portion of the first signal line SL1 may be disposed in the first non-transmissive area NTA1. For example, the third and fourth subpixels P3 and P4 may be provided to overlap at least a portion of the first signal line SL1, and may alternately be disposed along the first signal line SL1. The first signal line SL1, the third driving transistor TR3 of the third subpixel P3 and the fourth driving transistor TR4 of the fourth subpixel P4 may be disposed in the first non-transmissive area NTA1.

The first signal line SL1 may be provided in the first non-transmissive area NTA1 and extended in the first direction (e.g., X-axis direction). The first signal line SL1 may include a plurality of signal lines, for example, at least one scan line SCANL1 or SCANL2.

In the following description, the first non-transmissive area NTA1 is provided with two scan lines SCANL1 and SCANL2, but is not limited thereto. The first non-transmissive area NTA1 may be provided with only one scan line.

In detail, the first scan line SCANL1 may be provided in the first non-transmissive area NTA1 and extended in the first direction (e.g., X-axis direction). The first scan line SCANL1 may supply a scan signal to at least a portion of the subpixels P1, P2, P3 and P4 provided in the display area DA.

For example, the first scan line SCANL1 may supply a first scan signal to the first driving transistor TR1 of the first subpixel P1 and the third driving transistor TR3 of the third subpixel P3.

The second scan line SCANL2 may be provided in the first non-transmissive area NTA1 and extended in the first direction (e.g., X-axis direction). The second scan line SCANL2 may supply the scan signal to the subpixels except the subpixel connected with the first scan line SCANL1 among the subpixels P1, P2, P3 and P4 provided in the display area DA.

For example, the second scan line SCANL2 may supply a second scan signal to the second driving transistor TR2 of the second subpixel P2 and the fourth driving transistor TR4 of the fourth subpixel P4.

The first and second scan lines SCANL1 and SCANL2 may be provided on a layer different from that of the second signal line SL2. In detail, the first and second scan lines SCANL1 and SCANL2 may be provided on a layer different from the first data line DL1, the reference line REFL, and the second data line DL2.

In one embodiment, the first and second scan lines SCANL1 and SCANL2 may be provided on the same layer as one of the elements constituting the driving transistor TR. In detail, the first and second scan lines SCANL1 and SCANL2 may be provided on the same layer as any one of the active layer ACT, the gate electrode GE, the source electrode SE and the drain electrode DE of the driving transistor TR. For example, the first and second scan lines SCANL1 and SCANL2 may be provided on the same layer as the source electrode SE and the drain electrode DE.

Referring back to FIG. 2, the non-display area NDA may include a pad area PAD in which pads are disposed, and at least one scan driver 205.

In detail, the non-display area NDA may include a first non-display area NDA1 disposed on one side of the display area DA, a second non-display area NDA2 disposed on the other side perpendicular to one side of the display area DA, a third non-display area NDA3 disposed to be parallel with the first non-display area NDA1 with the display area DA interposed therebetween, and a fourth non-display area NDA4 disposed to be parallel with the second non-display area NDA2 with the display area DA interposed therebetween. At this time, the pads may be disposed in the third non-display area NDA3.

The first non-display area NDA1 may include a pixel power shorting bar VDD connected with a plurality of pixel power lines VDDL provided in the display area DA and a common power shorting bar VSS connected with a plurality of common power lines VSSL provided in the display area DA.

The scan driver 205 may be provided in any one of the second non-display area NDA2 and the fourth non-display area NDA4. The scan driver 205 is connected to the scan lines to supply scan signals. The scan driver 205 may be disposed on one side or both sides of the display area DA in a gate driver in panel (GIP) type. For example, as shown in FIG. 2, the scan driver 205 may be provided in the second non-display area NDA2 and the other scan driver 205 may be provided in the fourth non-display area NDA4, but are not limited thereto. In some embodiments, the scan driver 205 may be provided in only one of the second non-display area NDA2 and the fourth non-display area NDA4, while the other of the second non-display area NDA2 and the fourth non-display area NDA4 does not have a scan driver 205.

A ground line GND may be provided in the first non-display area NDA1, the second non-display area NDA2, and the fourth non-display area NDA4. The ground line GND may be provided at an edge of at least one side of the substrate 111. For example, the ground line GND may be provided along the edges of the sides except the side, in which the pad area PA is disposed, among the plurality of sides of the substrate 111.

Hereinafter, the pixel power shorting bar VDD, the common power shorting bar VSS, the scan driver 205 and the ground line GND, which are provided in the non-display area NDA, will be described in more detail.

Figure 6:
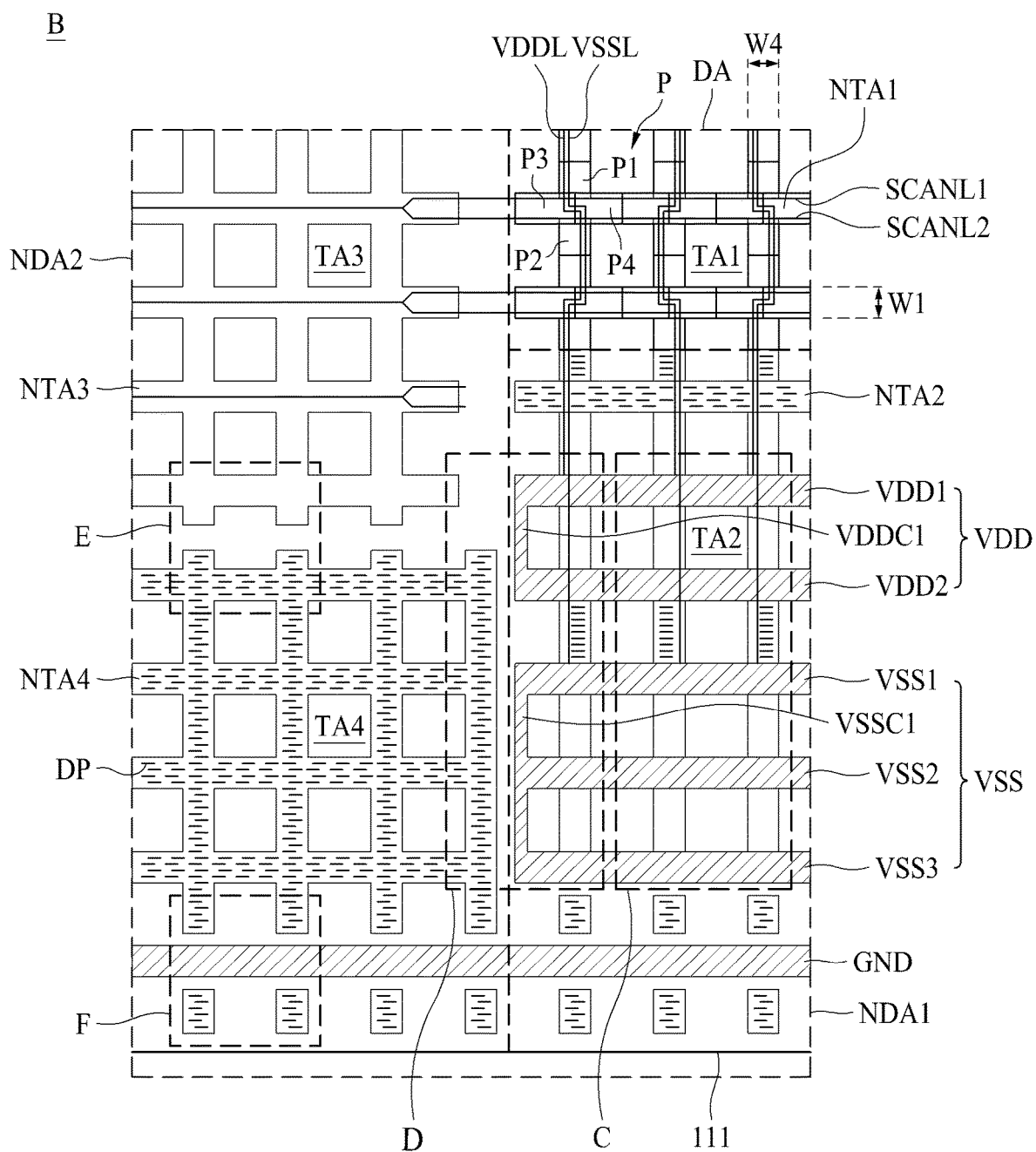
FIG. 6 is an enlarged view illustrating an area B of FIG. 2.
Figure 7:
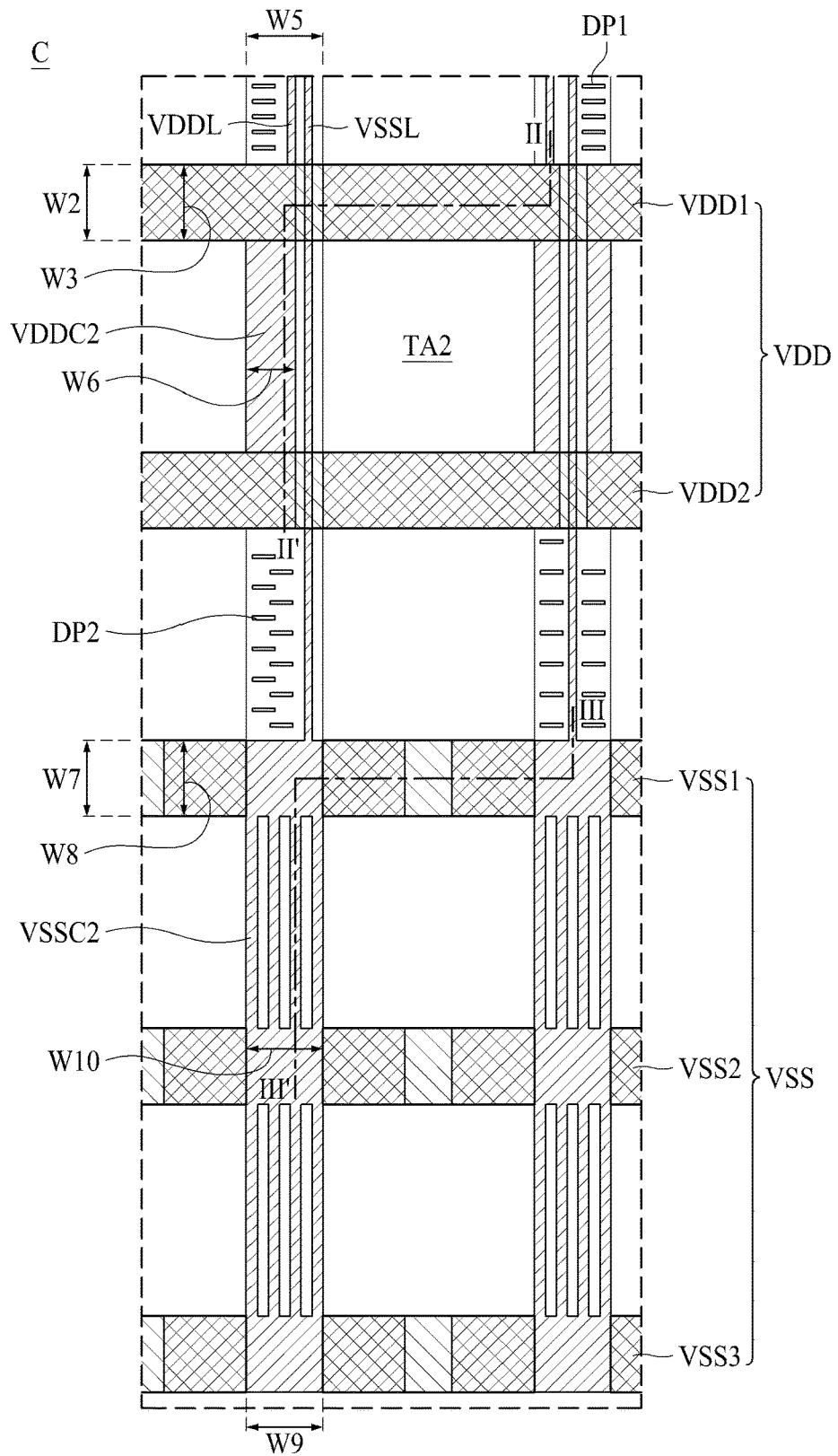
FIG. 7 is an enlarged view illustrating an area C of FIG. 6.
Figure 8:
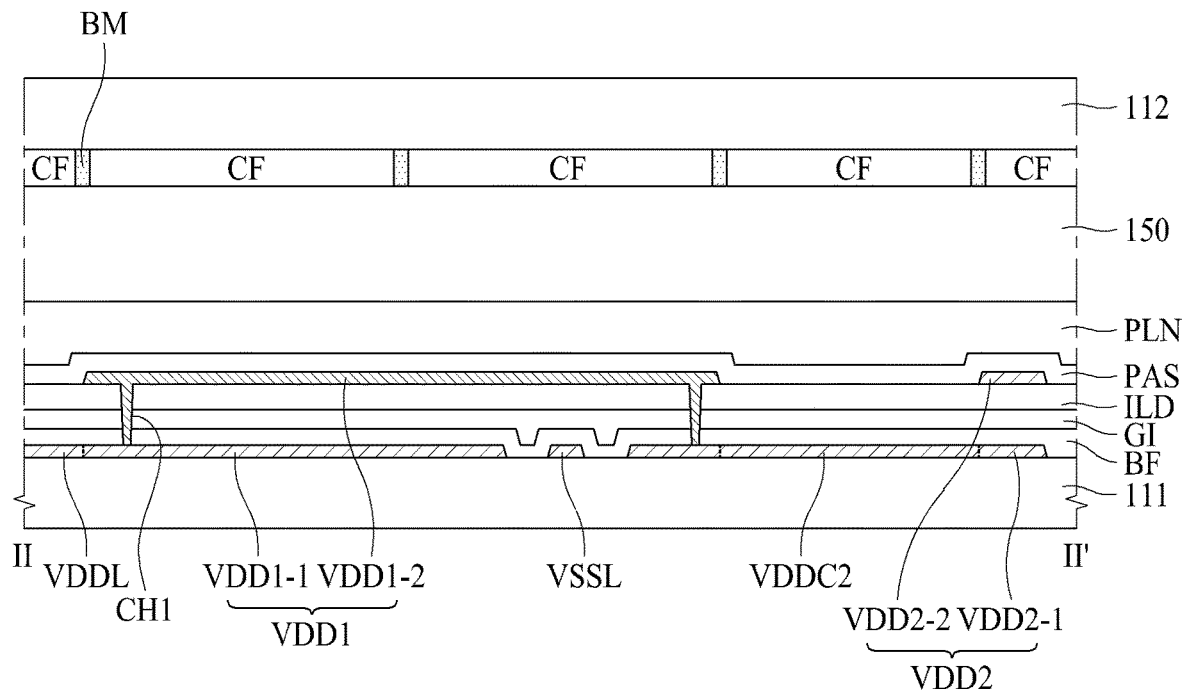
FIG. 8 is a cross-sectional view taken along line II-II' of FIG. 7.
Figure 9:
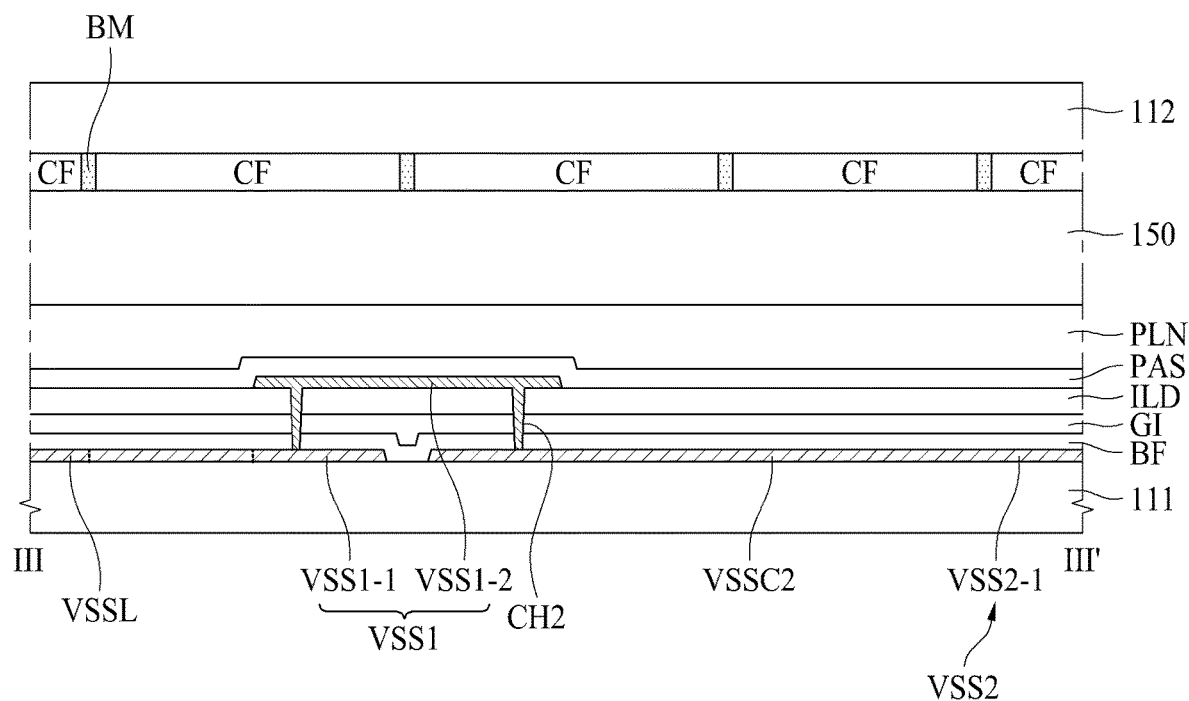
FIG. 9 is a cross-sectional view taken along line of III-III' FIG. 7.
Figure 10:
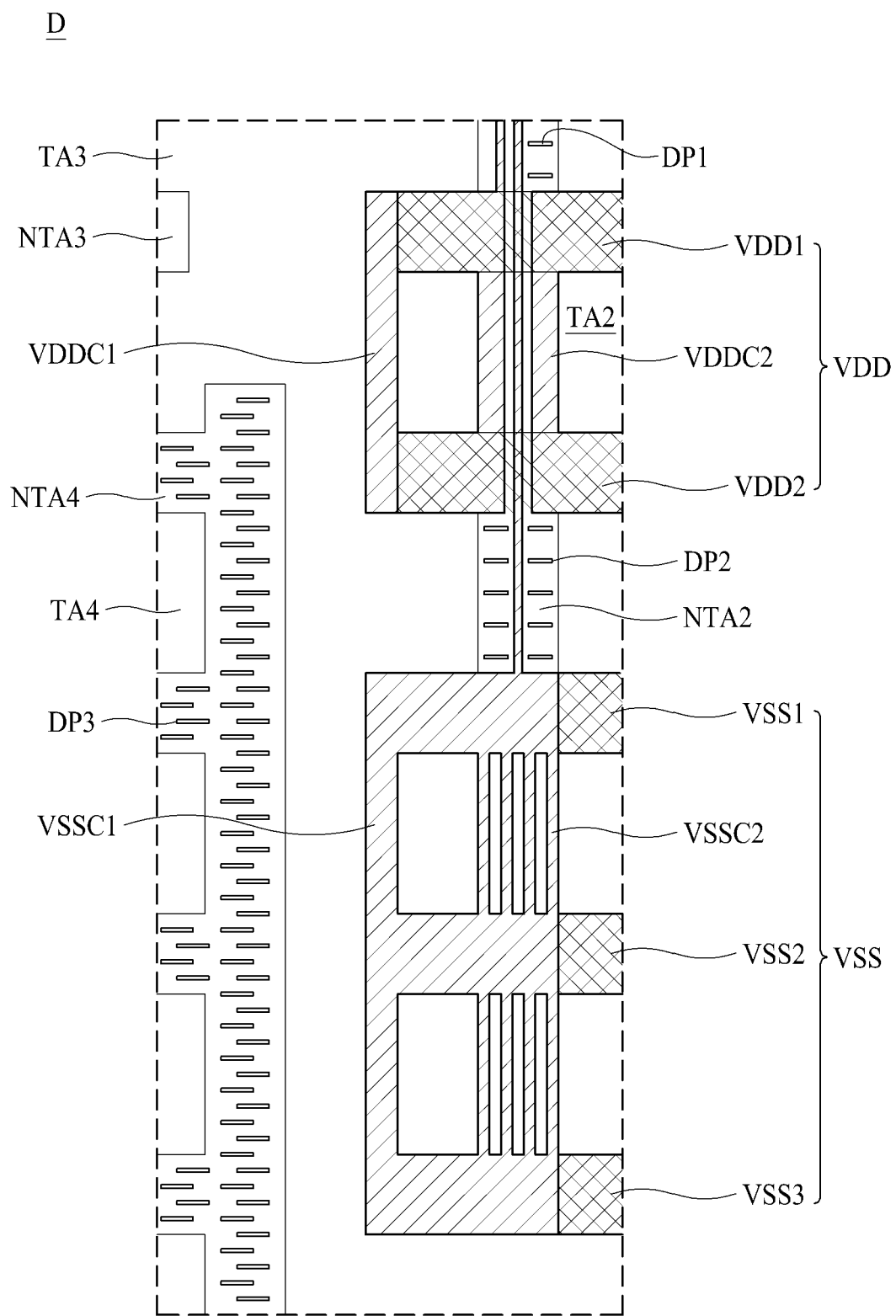
FIG. 10 is a view illustrating an area D of FIG. 6.
Figure 11:
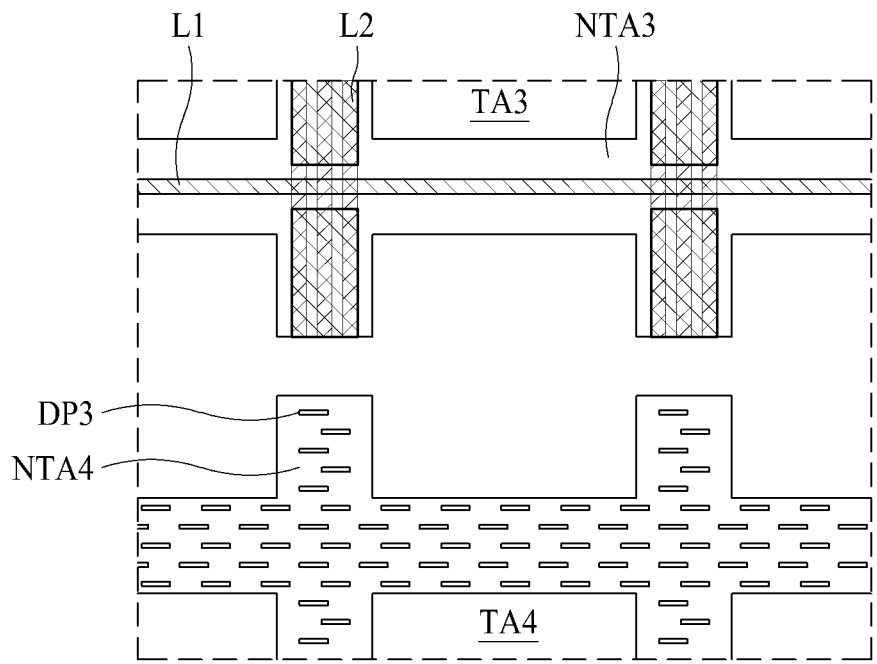
FIG. 11 is a view illustrating an area E of FIG. 6.
Figure 12:
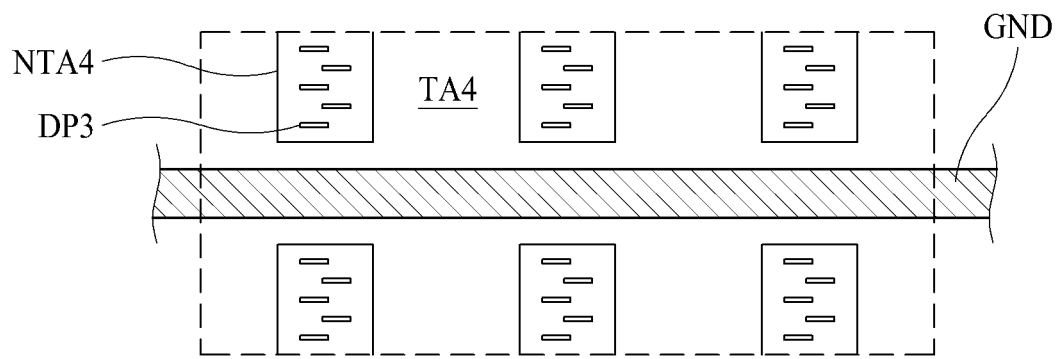
FIG. 12 is a view illustrating an area F of FIG. 6.
Figure 13:
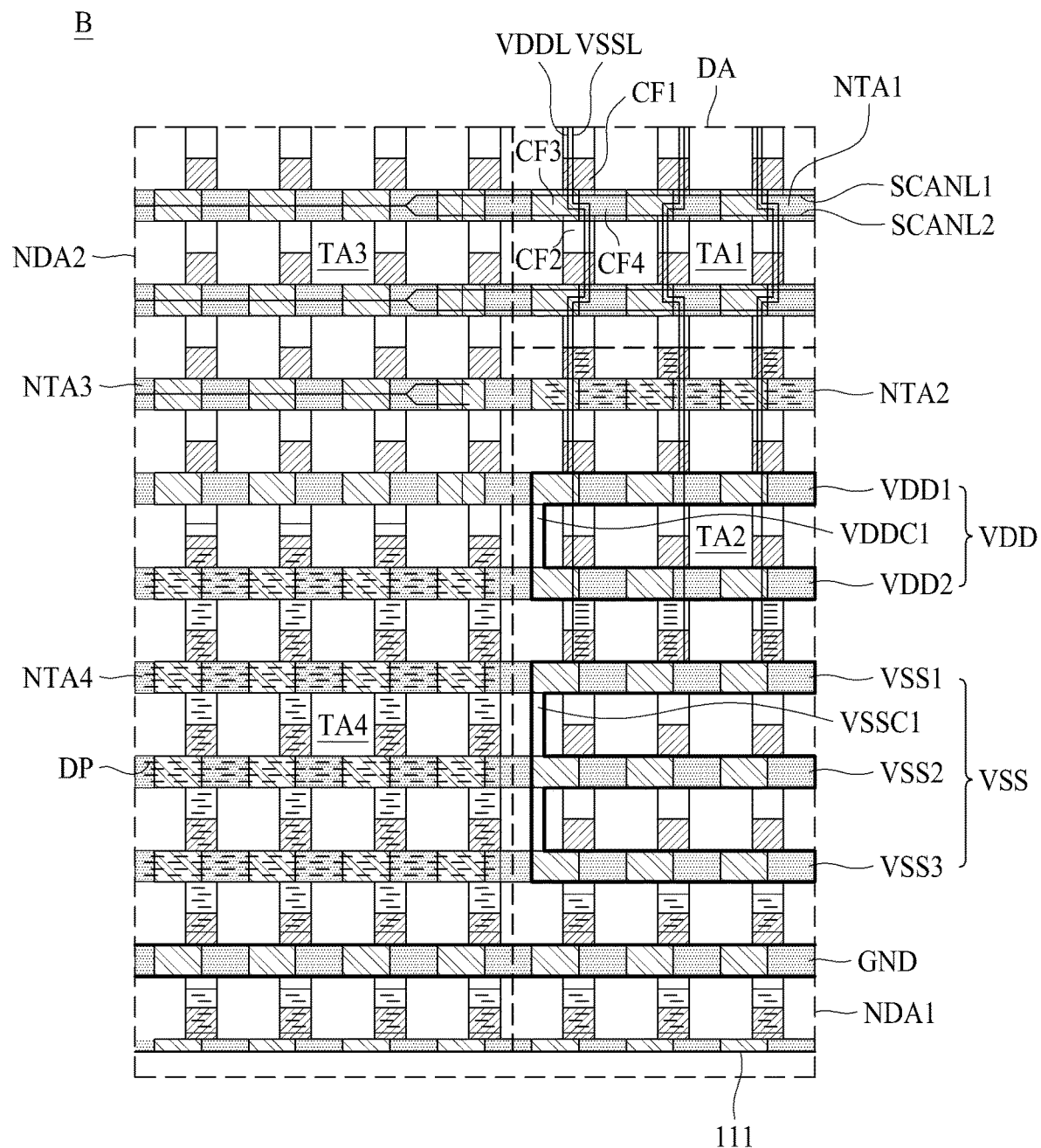
FIG. 13 is a view illustrating an example in which a color filter is provided in a display area, a first non-display area and a second non-display area.

FIG. 6 is an enlarged view illustrating an area B of FIG. 2, FIG. 7 is an enlarged view illustrating an area C of FIG. 6, FIG. 8 is a cross-sectional view taken along line II-IP of FIG. 7, and FIG. 9 is a cross-sectional view taken along line of FIG. 7. FIG. 10 is a view illustrating an area D of FIG. 6, FIG. 11 is a view illustrating an area E of FIG. 6, FIG. 12 is a view illustrating an area F of FIG. 6, and FIG. 13 is a view illustrating an example in which a color filter is provided in a display area, a first non-display area and a second non-display area.

As described with reference to FIG. 3, the display area DA may include first non-transmissive areas NTA1 and a first transmissive area TA1 provided between the first non-transmissive areas NTA1. The first transmissive area TA1 is an area that passes through most of light incident from the outside, and the first non-transmissive area NTA1 is an area that does not transmit most of light incident from the outside.

The first non-transmissive area NTA1 may include pixel power lines VDDL, common power lines VSSL, reference lines, data lines, scan lines SCANL1 and SCANL2, and subpixels P1, P2, P3 and P4.

The scan lines SCANL1 and SCANL2 may be extended in the first direction (e.g., X-axis direction), and may cross the pixel power lines VDDL, the common power lines VSSL, the reference lines, and the data lines in the display area DA.

The pixel power lines VDDL, the common power lines VSSL, the reference lines, and the data lines may be extended from the display area DA in the second direction (e.g., Y-axis direction).

The first non-display area NDA1 may include second non-transmissive areas NTA2, and a second transmissive area TA2 provided between the second non-transmissive areas NTA2. The second transmissive area TA2 is an area that passes through light incident from the outside almost as it is, like the first transmissive area TA1, and the second non-transmissive area NTA2 is an area that does not transmit most of the light incident from the outside, like the first non-transmissive area NTA1.

The second non-transmissive area NTA2 may include a pixel power shorting bar VDD, a common power shorting bar VSS, pixel power lines VDDL, and common power lines VSSL.

The pixel power shorting bar VDD may be extended from the second non-transmissive area NTA2 in the first direction (e.g., X-axis direction). At this time, the pixel power shorting bar VDD provided in the second non-transmissive area NTA2 may be provided in a plural number. The pixel power shorting bar VDD may include, but is not limited to, a first pixel power shorting bar VDD1 and a second pixel power shorting bar VDD2 as shown in FIG. 6. The pixel power shorting bars VDD may be three or more.

When a plurality of pixel power shorting bars VDD are provided as described above, each of the first pixel power shorting bar VDD1 and the second pixel power shorting bar VDD2 may be extended in parallel with each other in the first direction (e.g., X-axis direction), and may be spaced apart from each other. The second non-transmissive area NTA2 may include a first pixel power connection electrode VDDC1 and a second pixel power connection electrode VDDC2 (shown in FIG. 7), which connect the first pixel power shorting bar VDD1 with the second pixel power shorting bar VDD2. The first pixel power connection electrode VDDC1 may be extended in the second direction as shown in FIG. 10, and may connect at least one end of the first pixel power shorting bar VDD1 with at least one end of the second pixel power shorting bar VDD2. For example, one first pixel power connection electrode VDDC1 may connect one end of the first pixel power shorting bar VDD1 with one end of the second pixel power shorting bar VDD2. The other first pixel power connection electrode VDDC1 may connect the other end of the first pixel power shorting bar VDD1 with the other end of the second pixel power shorting bar VDD2.

The transparent display panel 110 according to one embodiment of the present disclosure is characterized in that the ends of the plurality of pixel power shorting bars VDD1 and VDD2 are connected with each other. A current may be concentrated on ends of electrode patterns. When the ends of the electrode patterns are protruded and disposed to be adjacent to each other, static electricity may occur between the ends due to a current concentration phenomenon. In the transparent display panel 110 according to one embodiment of the present disclosure, the ends of the plurality of pixel power shorting bars VDD1 and VDD2 may be connected with each other through the first pixel power connection electrode VDDC1, whereby the current may not be concentrated on the end of each of the plurality of pixel power shorting bars VDD1 and VDD2. Therefore, in the transparent display panel 110 according to one embodiment of the present disclosure, the plurality of pixel power shorting bars VDD1 and VDD2 may prevent static electricity from occurring between the other electrodes or signal lines disposed to be adjacent thereto.

Meanwhile, the second pixel power connection electrode VDDC2 (shown in FIG. 7) may be extended from the second non-transmissive area NTA2 in the second direction (e.g., Y-axis direction) to connect the first pixel power shorting bar VDD1 with the second pixel power shorting bar VDD2. The second pixel power connection electrode VDDC2 may be disposed between two first pixel power connection electrodes VDDC1. In detail, the plurality of second pixel power connection electrodes VDDC2 may be disposed between one first pixel power connection electrode VDDC1 for connecting one end of the first pixel power shorting bar VDD1 with one end of the second pixel power shorting bar VDD2 and the other one first pixel power connection electrode VDDC1 for connecting the other end of the first pixel power shorting bar VDD1 with the other end of the second pixel power shorting bar VDD2.

The second pixel power connection electrode VDDC2 may be formed of one line, but is not limited thereto. The second pixel power connection electrode VDDC2 may be formed of a plurality of lines spaced apart from each other.

In the transparent display panel 110 according to one embodiment of the present disclosure, the second pixel power connection electrode VDDC2 provided in the second non-transmissive area NTA2 in the second direction may be provided with a plurality of lines, and thus may have a structure similar to that of the first non-transmissive area NTA1 provided with the plurality of signal lines. Therefore, the transparent display panel 110 according to one embodiment of the present disclosure may reduce the difference in visual appearance between the display area DA and the first non-transmissive area NTA1.

In the description, reference may be made to "visual uniformity" or "difference(s) in visual appearance." When various regions or areas of a transparent display panel, such as the transparent display panel 110, are configured in different manners, for example, to perform different functions, each of the regions or areas may exhibit slightly different visual characteristics. Examples of visual characteristics include, but are not limited to, transparency/transmission, reflectivity, haze, color, Moire effect, and the like. Two regions having "high" visual uniformity may include some or all of the visual characteristics at substantially the same level. When two regions have "low" visual uniformity, a noticeable interface may be present between the two regions, for example, due to one of the regions having a high transparency (e.g., >90%) and the other of the regions having low transparency (e.g., <85%). For example, one or more of the non-display areas NDA1-NDA4 may be visually recognizable if a large divergence in transmissivity is present between the non-display area and the display area DA.

The second transmissive area TA2 may be provided between the first pixel power shorting bar VDD1 and the second pixel power shorting bar VDD2.

The second transmissive area TA2 provided between the first pixel power shorting bar VDD1 and the second pixel power shorting bar VDD2 may have substantially the same shape or substantially the same light transmittance as that of the first transmissive area TA1 provided in the display area DA. In this case, "substantially the same shape" means that the natures of the shapes shown on the plane are the same as each other. The sizes or ratios may be the same as or different from each other. For example, the second transmissive area TA2 may have substantially the same width as that of the first transmissive area TA1 in the first direction, the second direction, or both.

For example, the first transmissive area TA1 provided in the display area DA may have a rectangular shape with rounded corners or pointed corners, but is not limited thereto. In this case, the second transmissive area TA2 may also have a rectangular shape, wherein the rectangular shape may have rounded or pointed corners.

Meanwhile, the second non-transmissive area NTA2 provided with the first pixel power shorting bar VDD1 and the second pixel power shorting bar VDD2 may have a width W2 in the second direction perpendicular to the first direction, which is substantially the same as a width W1 in the second direction of the first non-transmissive area NTA1 provided in the display area DA.

Each of the first pixel power shorting bar VDD1 and the second pixel power shorting bar VDD2 may be disposed in the second non-transmissive area NTA2 in the first direction. Therefore, as shown in FIG. 7, each of the first pixel power shorting bar VDD1 and the second pixel power shorting bar VDD2 may have the same width W3 as the width W2 in the second direction of the second non-transmissive area NTA2, or may have a width W3 smaller than the width W2 in the second direction of the second non-transmissive area NTA2.

As a result, the plurality of pixel power shorting bars VDD disposed in the first non-display area NDA1 may have the same width W3 as the width W1 in the second direction of the first non-transmissive area NTA1 provided in the display area DA, or may have the width W3 smaller than the width W1 in the second direction of the first non-transmissive area NTA1.

Meanwhile, the second pixel power connection electrode VDDC2 may be extended in the second direction between the first pixel power shorting bar VDD1 and the second pixel power shorting bar VDD2. The second non-transmissive area NTA2 provided with the second pixel power connection electrode VDDC2 may have a width W5 in the first direction, which is substantially the same as the width W4 in the first direction of the first non-transmissive area NTA1 provided in the display area DA.

The second pixel power connection electrode VDDC2 may be disposed in the second non-transmissive area NTA2 in the second direction. Therefore, the second pixel power connection electrode VDDC2 may have a width W6 the same as the width W5 in the first direction of the second non-transmissive area NTA2, or may have a width W6 smaller than the width W5 in the first direction of the second non-transmissive area NTA2.

The second pixel power connection electrode VDDC2 may be provided as one line, but is not limited thereto. The second pixel power connection electrode VDDC2 may be provided with a plurality of lines as shown in FIG. 7. In addition, the second pixel power connection electrode VDDC2 may be disposed in parallel with the common power line VSSL in the second non-transmissive area NTA2. In this case, the second pixel power connection electrode VDDC2 may have a width W6 smaller than the width W5 in the first direction of the second non-transmissive area NTA2.

In the transparent display panel 110 according to one embodiment of the present disclosure, the plurality of pixel power shorting bars VDD provided in the first non-display area NDA1 do not have a wide width. In the transparent display panel 110 according to one embodiment of the present disclosure, the width W3 of the pixel power shorting bar VDD is the same as or smaller than the width W1 of the first non-transmissive area NTA1 provided in the display area DA, whereby the second transmissive area TA2 may be provided with a wide range in the first non-display area NDA1.

In the transparent display panel 110 according to one embodiment of the present disclosure, the plurality of pixel power shorting bars VDD are provided, whereby a total area of the pixel power shorting bar VDD may be increased.

Furthermore, in the transparent display panel 110 according to one embodiment of the present disclosure, the pixel power shorting bar VDD may be formed of a plurality of metal layers to increase its total area.

In detail, the pixel power shorting bar VDD may include a plurality of metal layers. For example, each of the first pixel power shorting bar VDD1 and the second pixel power shorting bar VDD2 may include a first metal layer VDD1-1 or VDD2-1 and a second metal layer VDD1-2 or VDD2-2 provided over the first metal layer VDD1-1 or VDD2-1 as shown in FIG. 8. The second metal layers VDD1-2 and VDD2-2 at least partially overlap the first metal layers VDD1-1 and VDD2-1, and may be connected with the first metal layers VDD1-1 and VDD2-1 through a first contact hole CH1.

At this time, the first metal layer VDD1-1 or VDD2-1 of each of the first pixel power shorting bar VDD1 and the second pixel power shorting bar VDD2 may be provided on the same layer as the pixel power line VDDL extended from the display area DA. For example, the first metal layer VDD1-1 or VDD2-1 of each of the first pixel power shorting bar VDD1 and the second pixel power shorting bar VDD2 may be provided on the same layer as the light shielding layer LS. The first metal layer VDD1-1 or VDD2-1 of each of the first pixel power shorting bar VDD1 and the second pixel power shorting bar VDD2 may be formed of the same material as that of the light shielding layer LS simultaneously with the light shielding layer LS.

The second metal layer VDD1-2 or VDD2-2 of each of the first pixel power shorting bar VDD1 and the second pixel power shorting bar VDD2 may be made of an opaque metal material having low resistance. For example, the second metal layer VDD1-2 or VDD2-2 of each of the first pixel power shorting bar VDD1 and the second pixel power shorting bar VDD2 may be provided on the same layer as the source electrode SE and the drain electrode DE of the driving transistor TR provided in the display area DA. The second metal layer VDD1-2 or VDD2-2 of each of the first pixel power shorting bar VDD1 and the second pixel power shorting bar VDD2 may be formed of the same material as that of the source electrode SE and the drain electrode DE of the driving transistor TR simultaneously with the source electrode SE and the drain electrode DE. In this case, the second metal layer VDD1-2 or VDD2-2 of each of the first pixel power shorting bar VDD1 and the second pixel power shorting bar VDD2 may be connected to the first metal layer VDD1-1 or VDD2-1 through a plurality of first contact holes CH1 passing through an interlayer dielectric film ILD, a gate insulating film GI, and a buffer film BF.

In the transparent display panel 110 according to one embodiment of the present disclosure, each of the plurality of pixel power shorting bars VDD1 and VDD2 provided in the first non-display area NDA1 is provided as a double layer, whereby the total area of the pixel power shorting bar VDD may be increased. Therefore, in the transparent display panel 110 according to one embodiment of the present disclosure, even though the pixel power shorting bar VDD is formed with a small width W3, resistance of the pixel power shorting bar VDD may be prevented from being increased.

Also, in the transparent display panel 110 according to one embodiment of the present disclosure, the second metal layers VDD1-2 and VDD2-2 of the first pixel power shorting bar VDD1 and the second pixel power shorting bar VDD2 are connected to the first metal layers VDD1-1 and VDD2-1 of the first pixel power shorting bar VDD1 and the second pixel power shorting bar VDD2, respectively, through the plurality of first contact holes CH1, whereby the first metal layers VDD1-1 and VDD2-1 may stably be connected with the second metal layers VDD1-2 and VDD2-2, respectively.

The common power shorting bar VSS may be extended from the second non-transmissive area NTA2 in the first direction (e.g., X-axis direction). At this time, the common power shorting bar VSS provided in the second non-transmissive area NTA2 may be provided in a plural number. The common power shorting bar VSS may include, but is not limited to, a first common power shorting bar VSS1, a second common power shorting bar VSS2, and a third common power shorting bar VSS3, as shown in FIG. 6. The common power shorting bars VSS may be two or four or more.

When the plurality of common power shorting bars VSS are provided as above, the first common power shorting bar VSS1, the second common power shorting bar VSS2 and the third common power shorting bar VSS3 may be extended in parallel with one another in the first direction (e.g., X-axis direction) and spaced apart from one another. The second non-transmissive area NTA2 may include a first common power connection electrode VSSC1 and a second common power connection electrode VSSC2, which connect the first common power shorting bar VSS1, the second common power shorting bar VSS2 and the third common power shorting bar VSS3 with one another.

The first common power connection electrode VSSC1 may be extended in the second direction as shown in FIG. 10 to connect at least one end of the first common power shorting bar VSS1, at least one end of the second common power shorting bar VSS2, and at least one end of the third common power shorting bar VSS3 with one another. For example, one first common power connection electrode VSSC1 may connect one end of the first common power shorting bar VSS1, one end of the second common power shorting bar VSS2, and one end of the third common power shorting bar VSS3 with one another. The other first common power connection electrode VSSC1 may connect the other end of the first common power shorting bar VSS1, the other end of the second common power shorting bar VSS2, and the other end of the third common power shorting bar VSS3 with one another.

The transparent display panel 110 according to one embodiment of the present disclosure is characterized in that the ends of the plurality of common power shorting bars VSS1, VSS2 and VSS3 are connected with one another. A current may be concentrated on ends of electrode patterns. When the ends of the electrode patterns are protruded and disposed to be adjacent to each other, static electricity may occur between the ends due to a current concentration phenomenon. In the transparent display panel 110 according to one embodiment of the present disclosure, the ends of the plurality of common power shorting bars VSS1, VSS2 and VSS3 may be connected with one another through the first common power connection electrode VSSC1, whereby the current may not be concentrated on the end of each of the plurality of common power shorting bars VSS1, VSS2 and VSS3. Therefore, in the transparent display panel 110 according to one embodiment of the present disclosure, the plurality of common power shorting bars VSS1, VSS2 and VSS3 may prevent static electricity from occurring between the other electrodes or signal lines disposed to be adjacent thereto.

The second common power connection electrode VSSC2 may be extended from the second non-transmissive area NTA2 in the second direction (e.g., Y-axis direction) to connect the first common power shorting bar VSS1 with the second common power shorting bar VSS2, or connect the second common power shorting bar VSS2 with the third common power shorting bar VSS3. The second common power connection electrode VSSC2 may be disposed between two first common power connection electrodes VSSC1. In detail, the plurality of the second common power connection electrode VSSC2 may be disposed between one first common power connection electrode VSSC1, which connect one end of the first common power shorting bar VSS1, one end of the second common power shorting bar VSS2 and one end of the third common power shorting bar VSS3 with one another, and the other one first common power connection electrode VSSC1, which connect the other end of the first common power shorting bar VSS1, the other end of the second common power shorting bar VSS2, and the other end of the third common power shorting bar VSS3 with one another.

The second common power connection electrode VSSC2 may be formed of one line, but is not limited thereto. The second common power connection electrode VSSC2 may be formed of a plurality of lines spaced apart from each other (e.g., in the first direction).

In the transparent display panel 110 according to one embodiment of the present disclosure, the second common power connection electrode VSSC2 provided in the second non-transmissive area NTA2 in the second direction may be provided with a plurality of lines, and thus may have a structure similar to that of the first non-transmissive area NTA1 provided with the plurality of signal lines. Therefore, the transparent display panel 110 according to one embodiment of the present disclosure may reduce the difference between the display area DA and the first non-display area NTA1.

The second transmissive area TA2 may be provided among the first common power shorting bar VSS1, the second common power shorting bar VSS2 and the third common power shorting bar VSS3.

The second transmissive area TA2 provided among the first common power shorting bar VSS1, the second common power shorting bar VSS2 and the third common power shorting bar VSS3 may have substantially the same shape as that of the first transmissive area TA1 provided in the display area DA. In this case, substantially the same shape means that the natures of the shapes shown on the plane are the same as each other. The sizes or ratios may be the same as or different from each other.

For example, the first transmissive area TA1 provided in the display area DA may have a rectangular shape with rounded corners or pointed corners, but is not limited thereto. In this case, the second transmissive area TA2 may also have a rectangular shape, wherein the rectangular shape may have rounded or pointed corners.

Meanwhile, the second non-transmissive area NTA2 provided with the first common power shorting bar VSS1, the second common power shorting bar VSS2 and the third common power shorting bar VSS3 may have a width W7 in the second direction substantially perpendicular to the first direction, which is substantially the same as the width W1 in the second direction of the first non-transmissive area NTA1 provided in the display area DA.

Each of the first common power shorting bar VSS1, the second common power shorting bar VSS2 and the third common power shorting bar VSS3 may be disposed in the second non-transmissive area NTA2 in the first direction. Therefore, as shown in FIG. 7, each of the first common power shorting bar VSS1, the second common power shorting bar VSS2 and the third common power shorting bar VSS3 may have the same width W8 as the width W7 in the second direction of the second non-transmissive area NTA2, or may have a width W8 smaller than the width W7 in the second direction of the second non-transmissive area NTA2.

As a result, the plurality of common power shorting bars VSS disposed in the first non-display area NDA1 may have the same width W8 as the width W1 in the second direction of the first non-transmissive area NTA1 provided in the display area DA, or may have the width W8 smaller than the width W1 in the second direction of the first non-transmissive area NTA1.

Meanwhile, the second common power connection electrode VSSC2 may be extended in the second direction between the first common power shorting bar VSS1 and the second common power shorting bar VSS2 or between the second common power shorting bar VSS2 and the third common power shorting bar VSS3. The second non-transmissive area NTA2 provided with the second common power connection electrode VSSC2 may have a width W9 in the first direction, which is substantially the same as the width W4 in the first direction of the first non-transmissive area NTA1 provided in the display area DA.

The second common power connection electrode VSSC2 may be disposed in the second non-transmissive area NTA2 in the second direction. Therefore, the second common power connection electrode VSSC2 may have a width W10 the same as the width W9 in the first direction of the second non-transmissive area NTA2, or may have a width W10 smaller than the width W9 in the first direction of the second non-transmissive area NTA2.

The second common power connection electrode VSSC2 may be provided as one line, but is not limited thereto. The second common power connection electrode VSSC2 may be provided with a plurality of lines as shown in FIG. 7. In this case, the second common power connection electrode VSSC2 may have a width W10 smaller than the width W9 in the first direction of the second non-transmissive area NTA2.

In the transparent display panel 110 according to one embodiment of the present disclosure, the plurality of common power shorting bars VSS provided in the first non-display area NDA1 do not have a wide width. In the transparent display panel 110 according to one embodiment of the present disclosure, the width W8 of the common power shorting bar VSS is the same as or smaller than the width W1 of the first non-transmissive area NTA1 provided in the display area DA, thereby making sure of the second transmissive area TA2 of a wide range in the first non-display area NDA1.

In the transparent display panel 110 according to one embodiment of the present disclosure, the plurality of common power shorting bars VSS are formed, whereby a total area of the common power shorting bar VSS may be increased.

Furthermore, in the transparent display panel 110 according to one embodiment of the present disclosure, the common power shorting bar VSS may be formed of a plurality of metal layers to increase its total area.

In detail, the common power shorting bar VSS may include a plurality of metal layers. For example, each of the first common power shorting bar VSS1 and the second common power shorting bar VSS2 may include a first metal layer VSS1-1 or VSS2-1 and a second metal layer VSS1-2 or VSS1-2 provided over the first metal layer VSS1-1 or VSS2-1 as shown in FIG. 9. The second metal layers VSS1-2 and VSS2-2 at least partially overlap the first metal layers VSS1-1 and VSS2-1, and may be connected with the first metal layers VSS1-1 and VSS2-1 through a second contact hole CH2.

At this time, the first metal layer VSS1-1 or VSS2-1 of each of the first common power shorting bar VSS1, the second common power shorting bar VSS2 and the third common power shorting bar VSS3 may be provided on the same layer as the common power line VSSL extended from the display area DA. For example, the first metal layer VSS1-1 or VSS2-1 of each of the first common power shorting bar VSS1, the second common power shorting bar VSS2 and the third common power shorting bar VSS3 may be provided on the same layer as the light shielding layer LS. The first metal layer VSS1-1 or VSS2-1 of each of the first common power shorting bar VSS1, the second common power shorting bar VSS2 and the third common power shorting bar VSS3 may be formed of the same material as that of the light shielding layer LS simultaneously with the light shielding layer LS.

The second metal layer VSS1-2 or VSS2-2 of each of the first common power shorting bar VSS1, the second common power shorting bar VSS2 and the third common power shorting bar VSS3 may be made of an opaque metal material having low resistance. For example, the second metal layer VSS1-2 or VSS2-2 of each of the first common power shorting bar VSS1, the second common power shorting bar VSS2 and the third common power shorting bar VSS3 may be provided on the same layer as the source electrode SE and the drain electrode DE of the driving transistor TR provided in the display area DA. The second metal layer VSS1-2 or VSS2-2 of each of the first common power shorting bar VSS1, the second common power shorting bar VSS2 and the third common power shorting bar VSS3 may be formed of the same material as that of the source electrode SE and the drain electrode DE of the driving transistor TR simultaneously with the source electrode SE and the drain electrode DE. In this case, the second metal layer VSS1-2 or VSS2-2 of each of the first common power shorting bar VSS1, the second common power shorting bar VSS2 and the third common power shorting bar VSS3 may be connected to the first metal layer VSS1-1 or VSS2-1 through a plurality of second contact holes CH2 passing through an interlayer dielectric film ILD, a gate insulating film GI, and a buffer film BF.

In the transparent display panel 110 according to one embodiment of the present disclosure, each of the plurality of common power shorting bars VSS1, VSS2 and VSS3 provided in the first non-display area NDA1 is provided as a double layer, whereby the total area of the common power shorting bar VSS may be increased. Therefore, in the transparent display panel 110 according to one embodiment of the present disclosure, even though the common power shorting bar VSS is formed with a small width W7, resistance of the common power shorting bar VSS may be prevented from being increased.

Also, in the transparent display panel 110 according to one embodiment of the present disclosure, the second metal layers VSS1-2 and VSS2-2 of each of the first common power shorting bar VSS1, the second common power shorting bar VSS2 and the third common power shorting bar VSS3 are connected to the first metal layers VSS1-1 and VSS2-1 of each of the first common power shorting bar VSS1, the second common power shorting bar VSS2 and the third common power shorting bar VSS3, whereby the first metal layers VSS1-1 and VSS2-1 may stably be connected with the second metal layers VSS1-2 and VSS2-2.

Meanwhile, the first non-display area NDA1 may be provided with a plurality of dummy patterns DP on at least a portion of the second non-transmissive area NTA2. At this time, the plurality of dummy patterns DP may be floating patterns that are not electrically connected to other elements. In detail, the plurality of dummy patterns DP may include a plurality of first dummy patterns DP1 provided between the display area DA and the pixel power shorting bar VDD, and a plurality of second dummy patterns DP2 provided between the pixel power shorting bar VDD and the common power shorting bar VSS.

Other electrodes or signal lines in addition to the pixel power line VDDL and the common power line VSSL may not be provided between the display area DA and the pixel power shorting bar VDD. In this case, the second non-transmissive area NTA2 disposed between the display area DA and the pixel power shorting bar VDD may have higher light transmittance than the first non-transmissive area NTA1 or the second non-transmissive area NTA2 provided with the pixel power shorting bar VDD and the common power shorting bar VSS. Therefore, the area between the display area DA and the pixel power shorting bar VDD may be recognized by a difference in light transmittance or visibility with other areas.

In the transparent display panel 110 according to one embodiment of the present disclosure, the plurality of first dummy patterns DP1 may be disposed in the area excluding the pixel power line VDDL and the common power line VSSL from the second non-transmissive area NTA2 provided between the display area DA and the pixel power shorting bar VDD.

The plurality of first dummy patterns DP1 may be formed of a conductive material. In one embodiment, the plurality of first dummy patterns DP1 may be formed of the same material as that of one of the light shielding layer LS, the gate electrode GE, the source electrode SE, and the drain electrode DE on the same layer as one of them. When the plurality of first dummy patterns DP1 are disposed on the same layer as the pixel power line VDDL or the common power line VS SL, the plurality of first dummy patterns DP1 may be disposed to be spaced apart from the pixel power line VDDL or the common power line VSSL.

Other electrodes or signal lines in addition to the common power line VSSL may not be provided between the pixel power shorting bar VDD and the common power shorting bar VSS. In this case, the second non-transmissive area NTA2 disposed between the pixel power shorting bar VDD and the common power shorting bar VSS may have higher light transmittance than the first non-transmissive area NTA1 or the second non-transmissive area NTA2 provided with the pixel power shorting bar VDD and the common power shorting bar VSS. Therefore, the area between the pixel power shorting bar VDD and the common power shorting bar VSS may be recognized by a difference in light transmittance or visibility with other areas.

In the transparent display panel 110 according to one embodiment of the present disclosure, the plurality of second dummy patterns DP2 may be disposed in the area excluding the common power line VSSL from the second non-transmissive area NTA2 provided between the pixel power shorting bar VDD and the common power shorting bar VSS.

The plurality of second dummy patterns DP2 may be formed of a conductive material. In one embodiment, the plurality of second dummy patterns DP2 may be formed of the same material as that of one of the light shielding layer LS, the gate electrode GE, the source electrode SE, and the drain electrode DE on the same layer as one of them. When the plurality of second dummy patterns DP2 are disposed on the same layer as the common power line VSSL, the plurality of second dummy patterns DP2 may be disposed to be spaced apart from the common power line VSSL.

Referring back to FIG. 6, the second non-display area NDA2 may include a third non-transmissive area NTA3, a third transmissive area TA3, a fourth non-transmissive area NTA4, and a fourth transmissive area TA4. The third transmissive area TA3 and the fourth transmissive area TA4 are areas that pass through light incident from the outside almost as it is, like the first transmissive area TA1, and the third non-transmissive area NTA3 and the fourth non-transmissive area NTA4 are areas that do not transmit most of light incident from the outside, like the first non-transmissive area NTA1. As shown in FIG. 6, the third transmissive area TA3 is positioned between the third non-transmissive areas NTA3, and the fourth transmissive area TA4 is positioned between the fourth non-transmissive areas NTA4. It may be appreciated that each of the third non-transmissive area NTA3 and the fourth non-transmissive area NTA4 may be a continuous region, such that the third transmissive area TA3 and the fourth transmissive area TA4 may be considered embedded in the third non-transmissive area NTA3 and the fourth non-transmissive area NTA4, respectively. The third transmissive area TA3 and the fourth transmissive area TA4 may be considered to be positioned between segments of the third non-transmissive area NTA3 and between segments of the fourth non-transmissive area NTA4, respectively. From the perspective of the third and fourth transmissive areas TA3, TA4, the third non-transmissive area NTA3 may surround (e.g., border) the third transmissive area TA3, and the fourth non-transmissive area NTA4 may surround (e.g., border) the fourth transmissive area TA4. Although not specifically labeled in FIG. 6, the third non-transmissive area NTA3 may border numerous third transmissive areas TA3, and the fourth non-transmissive area NTA4 may border numerous fourth transmissive areas TA4. The above discussion of "positioned between" is similarly applicable in the context of the first transmissive area TA1 and the first non-transmissive area NTA1, and in the context of the second transmissive area TA2 and the second non-transmissive area NTA2.

Each of the third transmissive area TA3 and the fourth transmissive area TA4 provided in the second non-display area NDA2 may have substantially the same shape or the same light transmittance as that of the first transmissive area TA1 provided in the display area DA. In this case, substantially the same shape means that the natures of the shapes shown on the plane are the same as each other. The sizes or ratios may be the same as or different from each other.

For example, the first transmissive area TA1 provided in the display area DA may have a rectangular shape with rounded corners or pointed corners, but is not limited thereto. In this case, each of the third transmissive area TA3 and the fourth transmissive area TA4 may also have a rectangular shape, wherein the rectangular shape may have rounded or pointed corners.

Each of the third non-transmissive area NTA3 and the fourth non-transmissive area NTA4 provided in the second non-display area NDA2 may substantially be the same as the first non-transmissive area NTA1 provided in the display area DA in the width W1 in the second direction or the width W4 in the first direction.

The third non-transmissive area NTA3 may be provided with a gate driver (e.g., the scan driver 205) connected to the scan lines SCANL1 and SCANL2 provided in the display area DA to supply a scan signal. The gate driver may include a plurality of circuit areas and a plurality of signal lines. The plurality of signal lines may include a plurality of first lines L1 extended in the first direction (e.g., X-axis direction) and a plurality of second lines L2 extended in the second direction (e.g., Y-axis direction).

An end of at least one of the plurality of signal lines of the gate driver may be protruded toward the ground line GND. In order to form a transmissive area having the same shape as that of the first transmissive area TA1 of the display area DA, the ground line GND may be diverged and protruded toward the gate driver. In this case, the end of the signal line of the gate driver and an end of an electrode pattern diverged from the ground line GND may be disposed to be adjacent to each other. Static electricity may occur between the end of the signal line of the gate driver and the end of the ground line GND due to a current concentration phenomenon, whereby a burnt phenomenon may occur.

In the transparent display panel 110 according to one embodiment of the present disclosure, as shown in FIGS. 11 and 12, a plurality of third dummy patterns DP3 may be provided between the gate driver and the ground line GND, whereby a spaced distance between the gate driver and the ground line GND may be increased.

In more detail, in the transparent display panel 110 according to one embodiment of the present disclosure, the ground line GND may be formed in the form of one line, and the plurality of third dummy patterns DP3 may be provided between the ground line GND and the plurality of signal lines L1 and L2 of the gate driver. In this case, the plurality of third dummy patterns DP3 may be provided in the fourth non-transmissive area NTA4, and may be floating patterns that are not electrically connected to other elements. The third dummy patterns DP3 may be made of substantially the same material as that of the ground line GND, and may be located in the same layer as the ground line GND. In one embodiment, the third dummy patterns DP3 and the ground line GND are or include a conductive material. For example, the third dummy patterns DP3 and the ground line GND may be or include (e.g., be made of) a metal material.

As a result, in the transparent display panel 110 according to one embodiment of the present disclosure, static electricity may be prevented from occurring between the gate driver and the ground line GND.

In addition, the plurality of third dummy patterns DP3 may be provided between the pixel power shorting bar VDD and the ground line GND and between the common power shorting bar VSS and the ground line GND. In detail, the plurality of third dummy patterns DP3 may be provided between the first pixel power connection electrode VDDC1 and the ground line GND and between the first common power connection electrode VSSC1 and the ground line GND, as shown in FIGS. 6 and 10.

In the transparent display panel 110 according to one embodiment of the present disclosure, the spaced distance between the first pixel power connection electrode VDDC1 and the ground line GND may be increased by the plurality of third dummy patterns DP3, whereby static electricity may be prevented from occurring between the first pixel power connection electrode VDDC1 and the ground line GND.

In addition, in the transparent display panel 110 according to one embodiment of the present disclosure, the spaced distance between the first common power connection electrode VSSC1 and the ground line GND may be increased by the plurality of third dummy patterns DP3, whereby static electricity may be prevented from occurring between the first common power connection electrode VSSC1 and the ground line GND.

In FIGS. 6 to 12, the first non-display area NDA1 and the second non-display area NDA2 are described. The third non-display area NDA3 may also have substantially the same structure as that of the second non-display area NDA2, and in this case, its detailed description will be omitted.

In the transparent display panel 110 according to one embodiment of the present disclosure, the first non-display area NDA1, the second non-display area NDA2 and the display area DA may have similar light transmittance. To this end, in the transparent display panel 110 according to one embodiment of the present disclosure, at least one of a size of the second transmissive area TA2 provided in a unit area, a size of the third transmissive area TA3 provided in a unit area, or a size of the fourth transmissive area TA4 provided in a unit area may be designed to be the same as the size of the first transmissive area TA1 provided in a unit area. It will be understood that "a size . . . provided in a unit area" may refer to area of transmissive area per unit of total area. For example, in the display area DA, the first non-transmissive area NTA1 may occupy a first area of the display area DA, and the first transmissive areas TA1 may occupy a second area of the display area DA. A unit area (e.g., 10 $cm^2$) of the display area DA may include a unit portion of the first area (e.g., 2 $cm^2$) occupied by the first non-transmissive areas NTA1 and a unit portion of the second area (e.g., 8 $cm^2$) occupied by the first transmissive areas TA1. As such, the "size of the first transmissive area TA1 provided in a unit area" may be expressed as the portion of the second area itself (e.g., 8 $cm^2$ for a 10 $cm^2$ unit area), or as a ratio of the portion of the second area to the unit area (e.g., 8 $cm^2$/10 $cm^2$, or 80%). It may be beneficial for the amount of transmissive area (e.g., TA1, TA2, TA3, TA4) per unit area to be substantially the same across one or more areas (e.g., DA, NDA1, NDA2, NDA3, NDA4), such that transmissivity is substantially uniform across the one or more areas. When the transparent display panel 110 is unpowered, if the transmissivity of the display area DA is different from those of the non-display areas NDA1-NDA4, viewing of objects or background through the transparent display panel 110 when unpowered may be inconsistent. For example, if the transmissivity in the non-display areas NDA1-NDA4 that border the display area DA is substantially lower than in the display area DA, a dark border or frame may be visible over the objects or background seen through the transparent display panel 110.

Therefore, in the transparent display panel 110 according to one embodiment of the present disclosure, transmittance similar to that of the display area DA may be embodied even in the first non-display area NDA1 and the second non-display area NDA2.

Moreover, in the transparent display panel 110 according to one embodiment of the present disclosure, color filters CF1, CF2, CF3 and CF4 may be provided in the second non-transmissive area NTA2 provided in the first non-display area NDA1, and the third non-transmissive area NTA3 and the fourth non-transmissive area NTA4, which are provided in the second non-display area NDA2.

In more detail, the color filters CF1, CF2, CF3 and CF4 and a black matrix (not shown) provided among the color filters CF1, CF2, CF3 and CF4 may be provided in the second non-transmissive area NTA2 provided in the first non-display area NDA1, and the third non-transmissive area NTA3 and the fourth non-transmissive area NTA4, which are provided in the second non-display area NDA2. In this case, as shown in FIG. 13, the color filters CF1, CF2, CF3 and CF4 may be patterned on the first non-display area NDA1 and the second non-display area NDA2 in the same shape as that of the color filters CF1, CF2, CF3 and CF4 provided in the display area DA as shown in FIG. 13.

The color filters CF1, CF2, CF3 and CF4 and the black matrix (not shown) may not be provided in the second transmissive area TA2 provided in the first non-display area NDA1 and the third non-transmissive area NTA3 and the fourth non-transmissive area NTA4, which are provided in second non-display area NDA2, as shown in FIG. 13, so as to enhance transmittance.

Therefore, the transparent display panel 110 according to one embodiment of the present disclosure may reduce a difference between transmittance in the first non-display area NDA1 and the second non-display area NDA2 and transmittance in the display area DA.

According to the present disclosure, the following advantageous effects may be obtained.

In the present disclosure, the plurality of pixel power shorting bars and the plurality of common power shorting bars may be provided in the non-display area, and the transmissive area may be provided between the plurality of pixel power shorting bars and between the plurality of common power shorting bars. As the transmissive area is provided in the non-display area, transmittance in the non-display area may be improved.

In addition, the transmissive area provided in the non-display area and the transmissive area provided in the display area have the same shape, whereby transmittance similar to that of the display area may be embodied in the non-display area.

In addition, as the ends of plurality of pixel power shorting bars are connected with each other, the current may be prevented from being concentrated on the ends of the pixel power shorting bars. As a result, static electricity may be prevented from occurring between the signal lines or the electrode patterns disposed to be adjacent to the pixel power shorting bar.

In addition, as the ends of plurality of common power shorting bars are connected with each other, the current may be prevented from being concentrated on the ends of the common power shorting bars. As a result, static electricity may be prevented from occurring between the signal lines or the electrode patterns disposed to be adjacent to the common power shorting bar.

In addition, the plurality of dummy patterns are provided between the gate driver and the ground line, between the pixel power shorting bar and the ground line, and between the common power shorting bar and the ground line, whereby static electricity may be prevented from occurring.

In addition, the color filters are provided in the non-display area, and are patterned in the same shape as that of the color filters provided in the display area, whereby a difference between transmittance in the non-display area and transmittance in the display area may be reduced. Therefore, the present disclosure may reduce recognition of the non-display area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. It is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
   a substrate having a display area, the display having a plurality of subpixels disposed thereon, a first non-display area being disposed on one side of the display area, and a second non-display area being disposed on another side of the display area;
   a plurality of power shorting bars provided in the first non-display area over the substrate, the plurality of power shorting bars being extended in parallel in a first direction, each of the plurality of power shorting bars being coupled to others of the plurality of power shorting bars on at least one end thereof;
   a plurality of power lines provided in the display area over the substrate, extended in a second direction, and coupled with the plurality of power shorting bars;
   a first transmissive area provided between the plurality of power lines; and
   a second transmissive area provided between the plurality of power shorting bars, and
   the first non-display area includes second non-transmissive areas having the plurality of power shorting bars therein, the second transmissive area being located between the second non-transmissive areas.

2. The transparent display device of claim 1, wherein each of the plurality of power shorting bars has:
   one end coupled to one first power connection electrode, the one first power connection electrode being extended in the second direction; and
   another end coupled to another first power connection electrode, the another first power connection electrode being extended in the second direction.

3. The transparent display device of claim 1, wherein, the display area includes first non-transmissive areas in which the plurality of subpixels are positioned, the first transmissive area being located between the first non-transmissive areas,
   and
   the second non-transmissive areas include a plurality of second power connection electrodes coupled to the plurality of power shorting bars.

4. The transparent display device of claim 3, wherein each of the plurality of second power connection electrodes includes a plurality of connection lines.

5. The transparent display device of claim 3, wherein the second non-transmissive area has substantially the same width as that of the first non-transmissive area in the first direction.

6. The transparent display device of claim 3, wherein the second non-transmissive area has substantially the same width as that of the first non-transmissive area in the second direction.

7. The transparent display device of claim 3, wherein a size of the first transmissive area provided in a unit area and a size of the second transmissive area provided in the unit area are the same as each other.

8. The transparent display device of claim 3, further comprising a color filter provided over the plurality of power shorting bars in the second non-transmissive area.

9. The transparent display device of claim 1, wherein each of the plurality of subpixels includes a first electrode, an organic light emitting layer, and a second electrode, and
   the power line is a pixel power line configured to supply a first power source to the first electrode or a common power line configured to supply a second power source to the second electrode.

10. The transparent display device of claim 1, further comprising a scan driver provided in the second non-display area,
    wherein the second non-display area includes:
    third non-transmissive areas having the scan driver therein, and
    a third transmissive area provided between the third non-transmissive areas, and
    the third transmissive area has substantially the same shape as that of the first transmissive area.

11. The transparent display device of claim 1, further comprising:
    a scan driver provided in the second non-display area;
    a ground line disposed along an edge of the substrate in the first non-display area and the second non-display area; and
    a plurality of dummy patterns provided between the ground line and the scan driver and between the ground line and the power shorting bars,
    wherein the second non-display area includes:
    fourth non-transmissive areas having the plurality of dummy patterns therein, and
    a fourth transmissive area provided between the fourth non-transmissive areas, and
    the fourth transmissive area has substantially the same shape as that of the first transmissive area.

12. The transparent display device of claim 11, wherein the plurality of dummy patterns are made of substantially the same material as that of the ground line and are located in the same layer as the ground line.

13. The transparent display device of claim 11, wherein the plurality of dummy patterns are disposed to be spaced apart from the scan driver and the ground line.

14. The transparent display device of claim 11, wherein the plurality of dummy patterns are disposed to be spaced apart from the power shorting bars.

15. A transparent display device comprising:
    a substrate provided with a display area, the display area having a plurality of subpixels disposed thereon, a first non-display area being disposed on one side of the display area, and a second non-display area being disposed on another side of the display area;
    a plurality of pixel power shorting bars provided in the first non-display area over the substrate, extended substantially in parallel in a first direction, and spaced apart from each other;
    a first pixel power connection electrode coupling ends of the plurality of pixel power shorting bars to each other;
    a plurality of common power shorting bars provided in the first non-display area over the substrate, extended substantially in parallel in the first direction, and spaced apart from each other; and
    a first common power connection electrode coupling ends of the plurality of common power shorting bars to each other, and
    the first non-display area includes second non-transmissive areas having the plurality of pixel power shorting bars, the first pixel power connection electrode, the plurality of common power shorting bars and the first common power connection electrode therein, and a second transmissive area positioned between the second non-transmissive areas.

16. The transparent display device of claim 15, further comprising:
    a plurality of pixel power lines provided in the display area over the substrate, extended in a second direction, and coupled with the plurality of pixel power shorting bars; and
    a plurality of common power lines provided in the display area over the substrate, extended in the second direction, and coupled with the plurality of common power shorting bars.

17. The transparent display device of claim 15, wherein the display area includes first non-transmissive areas having the plurality of subpixels therein, a first transmissive area positioned between the first non-transmissive areas,
    and a second transmissive area positioned between the second non-transmissive areas, and
    the second transmissive area has substantially a same width as that of the first transmissive area in the second direction.

18. The transparent display device of claim 17, wherein the second transmissive area has substantially the same light transmittance as that of the first transmissive area.

19. The transparent display device of claim 17, wherein the second transmissive area has substantially the same shape as that of the first transmissive area.

20. The transparent display device of claim 15, further comprising a scan driver positioned in the second non-display area, wherein the second non-display area includes third non-transmissive areas having the scan driver therein, and a third transmissive area positioned between the third non-transmissive areas, and the third transmissive area has substantially the same light transmittance as that of the first transmissive area.

21. The transparent display device of claim 15, further comprising:
- a scan driver provided in the second non-display area;
- a ground line disposed along an edge of the substrate in the first non-display area and the second non-display area; and
- a plurality of dummy patterns positioned between the ground line and the scan driver and between the ground line and the pixel power shorting bars, the common power shorting bars, or both;

wherein the second non-display area includes:
- fourth non-transmissive areas having the plurality of dummy patterns therein; and
- a fourth transmissive area provided between the fourth non-transmissive areas, and
- the fourth transmissive area has substantially the same shape as that of the first transmissive area.

22. The transparent display device of claim 21, wherein the plurality of dummy patterns are made of a metal material.

23. The transparent display device of claim 21, wherein the plurality of dummy patterns are disposed to be spaced apart from the scan driver, the ground line, the plurality of pixel power shorting bars, and the plurality of common power shorting bars.

24. The transparent display device of claim 15, wherein the plurality of pixel power shorting bars are made of a first metal layer and a second metal layer disposed over the first metal layer.

25. The transparent display device of claim 24, wherein at least a portion of the second metal layer of the pixel power shorting bar overlaps the first metal layer of the pixel power shorting bar and is coupled to the first metal layer of the pixel power shorting bar by a first contact hole.

26. The transparent display device of claim 24, further comprising a plurality of pixel power lines extended from the first metal layer of one pixel power shorting bar of the plurality of pixel power shorting bars, the one pixel power shorting bar being closest to the display area among the plurality of pixel power shorting bars in a second direction, the plurality of pixel power lines being configured to supply a first power source to the plurality of subpixels provided in the display area.

27. The transparent display device of claim 15, wherein the plurality of common power shorting bars are made of a first metal layer and a second metal layer disposed over the first metal layer.

28. The transparent display device of claim 27, wherein at least a portion of the second metal layer of the common power shorting bar overlaps the first metal layer of the common power shorting bar and is coupled to the first metal layer of the common power shorting bar through a second contact hole.

29. The transparent display device of claim 27, further comprising a plurality of common power lines extended from the first metal layer of one common power shorting bar of the plurality of common power shorting bars, the one common power shorting bar being closest to the display area among the plurality of common power shorting bars in a second direction, the plurality of common power shorting bars being configured to supply a second power source to the plurality of subpixels provided in the display area.

* * * * *